United States Patent
Ohmori et al.

(10) Patent No.: US 11,430,497 B2
(45) Date of Patent: *Aug. 30, 2022

(54) MAGNETIC STORAGE ELEMENT

(71) Applicant: SONY CORPORATION, Tokyo (JP)

(72) Inventors: Hiroyuki Ohmori, Kanagawa (JP); Masanori Hosomi, Tokyo (JP); Kazuhiro Bessho, Kanagawa (JP); Yutaka Higo, Kanagawa (JP); Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/836,063

(22) Filed: Mar. 31, 2020

(65) Prior Publication Data

US 2020/0227106 A1 Jul. 16, 2020

Related U.S. Application Data

(63) Continuation of application No. 16/091,732, filed as application No. PCT/JP2017/009571 on Mar. 9, 2017, now Pat. No. 10,861,521.

(30) Foreign Application Priority Data

Apr. 20, 2016 (JP) .................. 2016-084336

(51) Int. Cl.
*H01L 43/10* (2006.01)
*G11C 11/16* (2006.01)
(Continued)

(52) U.S. Cl.
CPC .......... *G11C 11/161* (2013.01); *H01L 27/222* (2013.01); *H01L 43/02* (2013.01);
(Continued)

(58) Field of Classification Search
None
See application file for complete search history.

(56) References Cited

U.S. PATENT DOCUMENTS 10,861,521 B2 * 12/2020 Ohmori ................ H01L 27/222
2011/0044099 A1 2/2011 Dieny
(Continued)

FOREIGN PATENT DOCUMENTS

CN 104170074 A 11/2014
CN 104662686 A 5/2015
(Continued)

OTHER PUBLICATIONS

Non-Final Office Action dated May 7, 2020 in related U.S. Appl. No. 16/091,732. 24 pages.
(Continued)

*Primary Examiner* — Benjamin P Sandvik
(74) *Attorney, Agent, or Firm* — K&L Gates LLP

(57) ABSTRACT

There is provided a magnetic storage element including: a storage layer; a reference layer provided at least one surface side of the storage layer with a non-magnetic layer in between; a magnetization fixation layer provided at a surface side opposite to a surface of the reference layer at which the storage layer is provided, with a non-magnetic layer in between; and a magnetization assist layer provided at a surface side opposite to a surface of the magnetization fixation layer at which the reference layer is provided, with a non-magnetic layer in between, in which change in a magnetization direction is easier than in the storage layer.

19 Claims, 16 Drawing Sheets

(51) Int. Cl.
  *H01L 43/02* (2006.01)
  *H01L 43/08* (2006.01)
  *H01L 27/22* (2006.01)

(52) U.S. Cl.
  CPC .............. *H01L 43/08* (2013.01); *H01L 43/10* (2013.01); *G11C 11/1675* (2013.01)

(56) References Cited

U.S. PATENT DOCUMENTS

| | | |
|---|---|---|
| 2012/0068281 A1 | 3/2012 | Saida et al. |
| 2013/0070522 A1 | 3/2013 | Saida et al. |
| 2013/0249024 A1 | 9/2013 | Saida et al. |
| 2013/0250665 A1 | 9/2013 | Kitagawa et al. |
| 2014/0085968 A1 | 3/2014 | Saida et al. |
| 2014/0110802 A1 | 4/2014 | Berger |
| 2014/0347918 A1 | 11/2014 | Lee et al. |
| 2015/0109853 A1 | 4/2015 | Sato et al. |
| 2015/0228889 A1 | 8/2015 | Yamane et al. |
| 2015/0311427 A1 | 10/2015 | Gottwald et al. |
| 2016/0240217 A1 | 8/2016 | Yamane et al. |

FOREIGN PATENT DOCUMENTS

| | | |
|---|---|---|
| CN | 105684178 A | 6/2016 |
| JP | 2015088520 A | 5/2015 |

OTHER PUBLICATIONS

International Search Report and Written Opinion prepared by the European Patent Office dated Jun. 12, 2017, for International Application No. PCT/JP2017/009571.

\* cited by examiner

[Fig. 1]
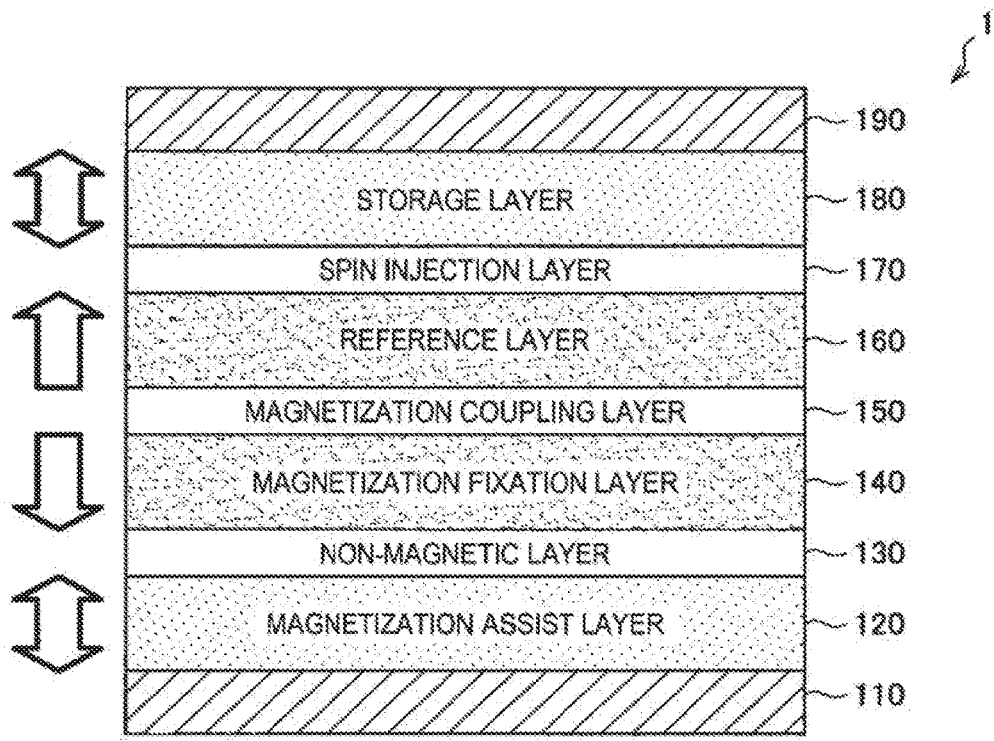
[Fig. 2A]
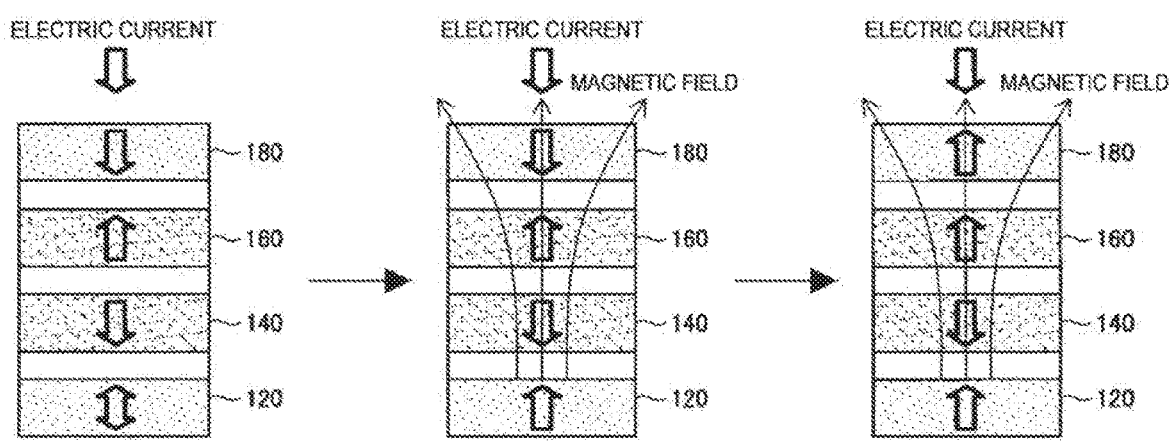

[Fig. 2B]
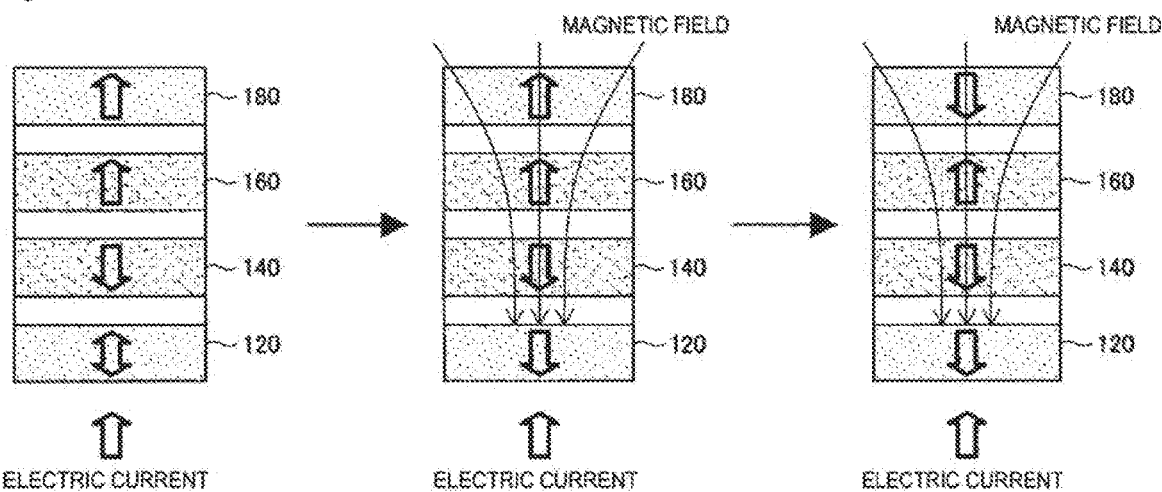
[Fig. 3]
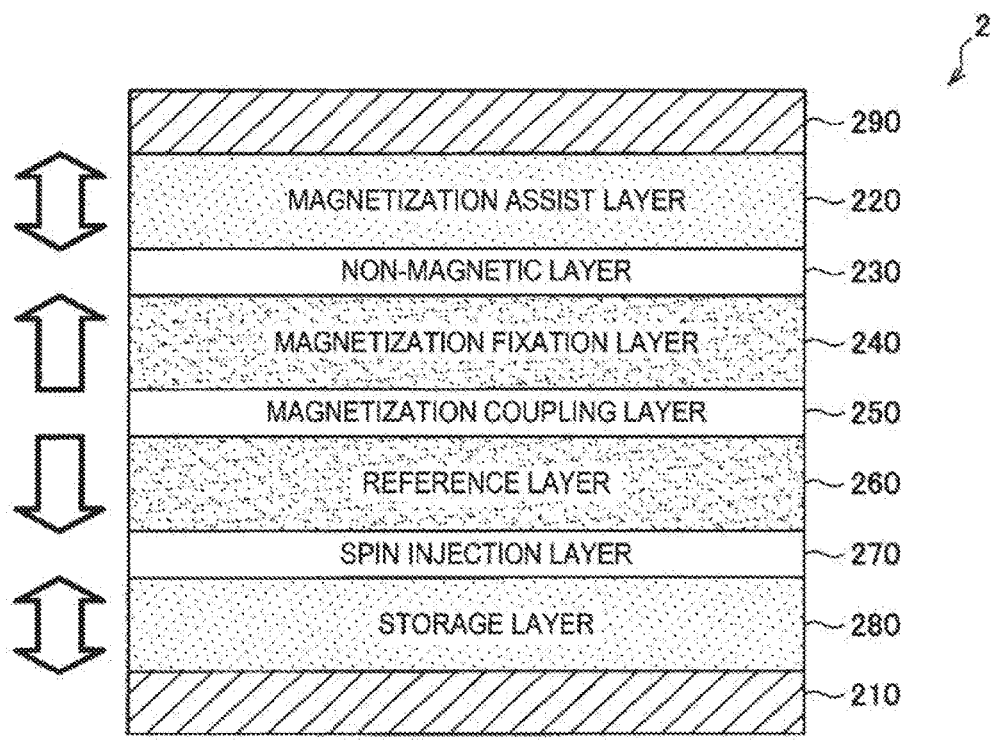

[Fig. 4]
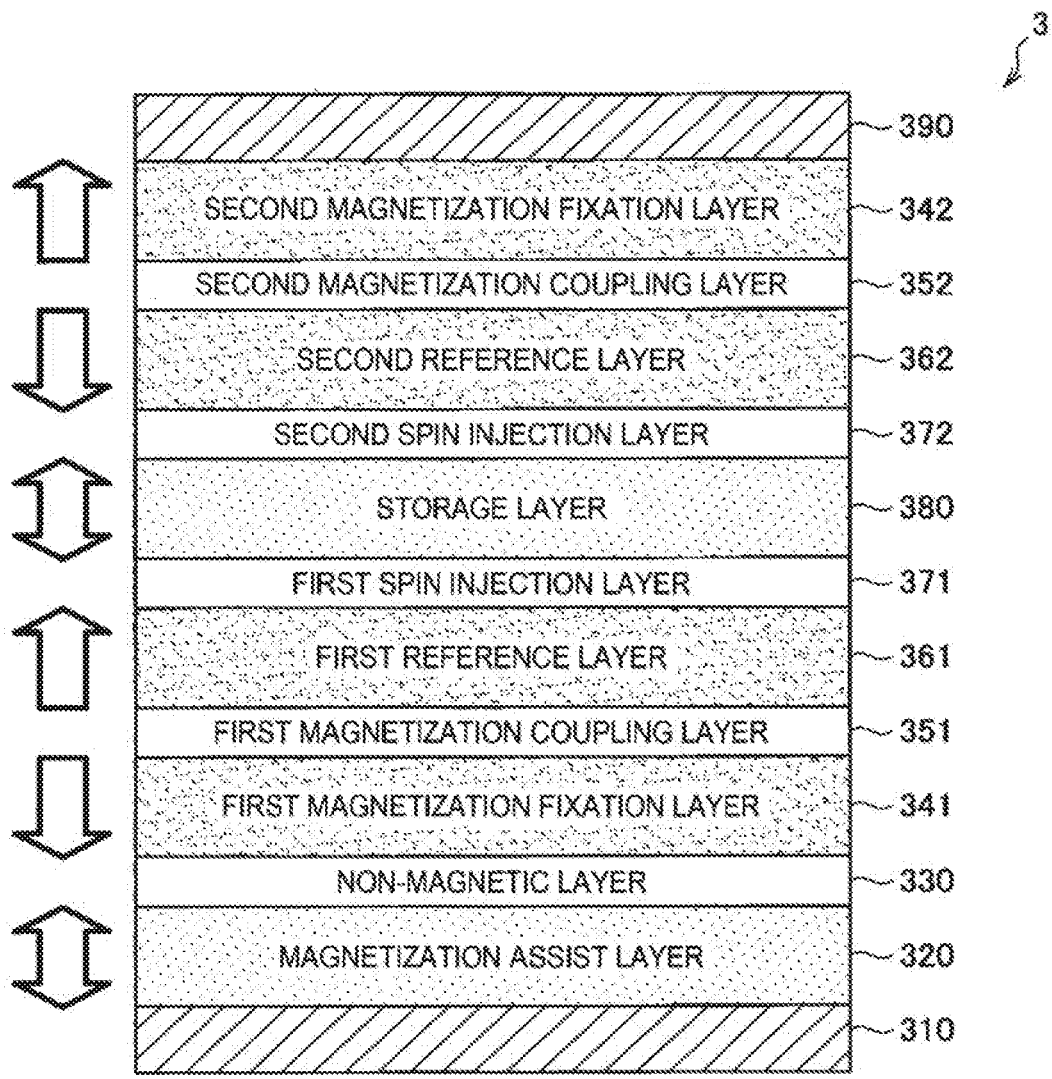

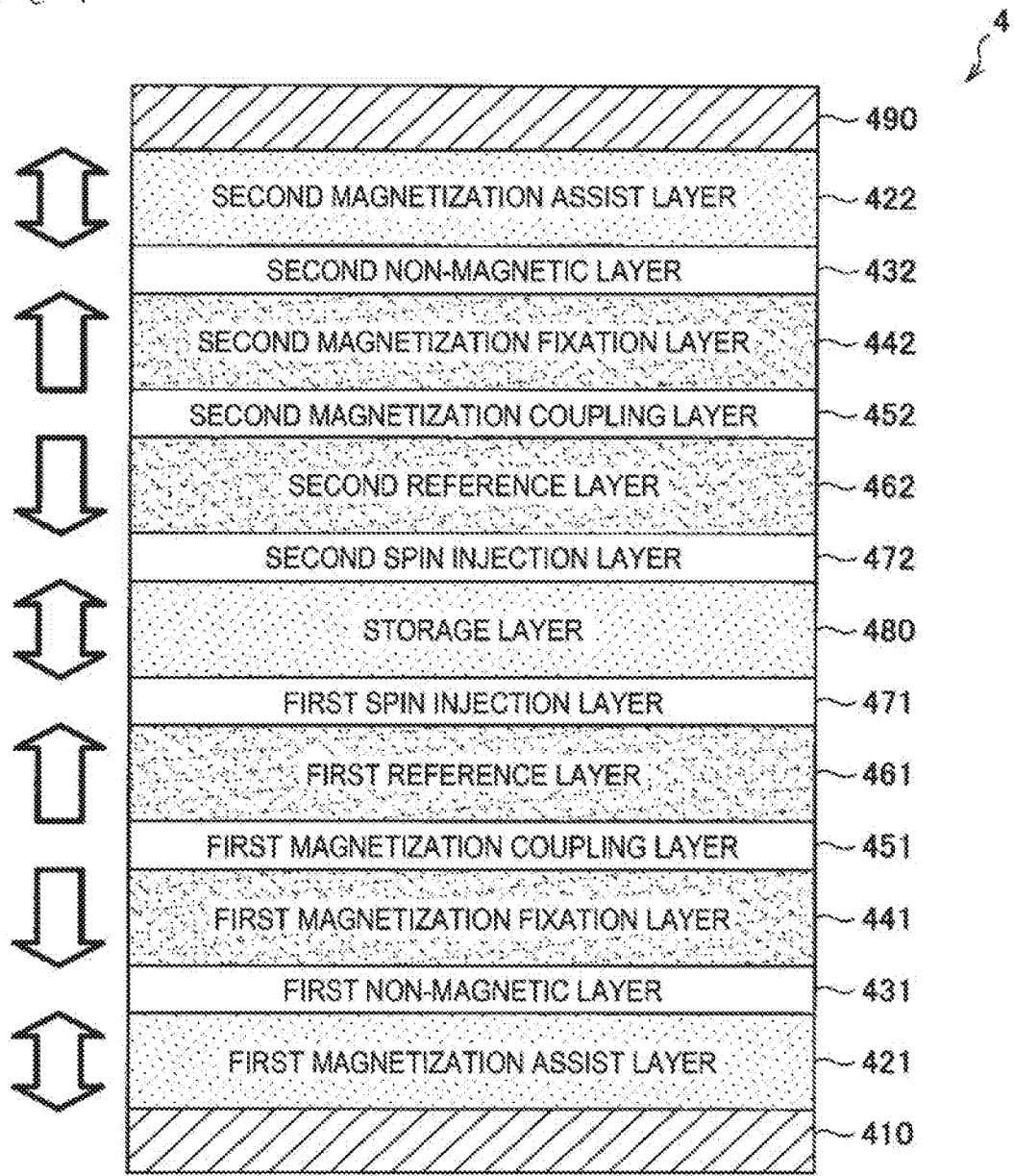
[Fig. 5]

[Fig. 6]
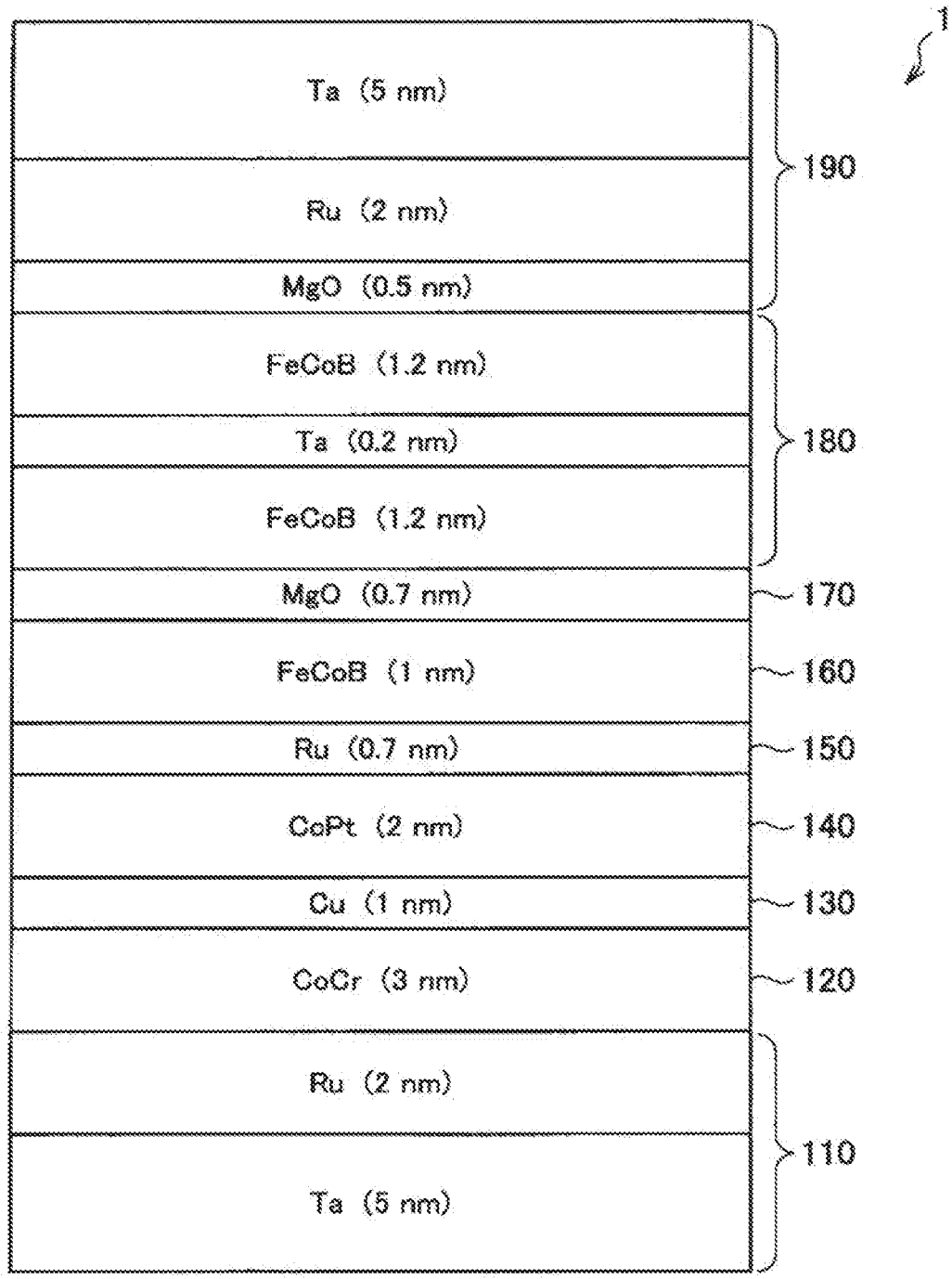

[Fig. 7]
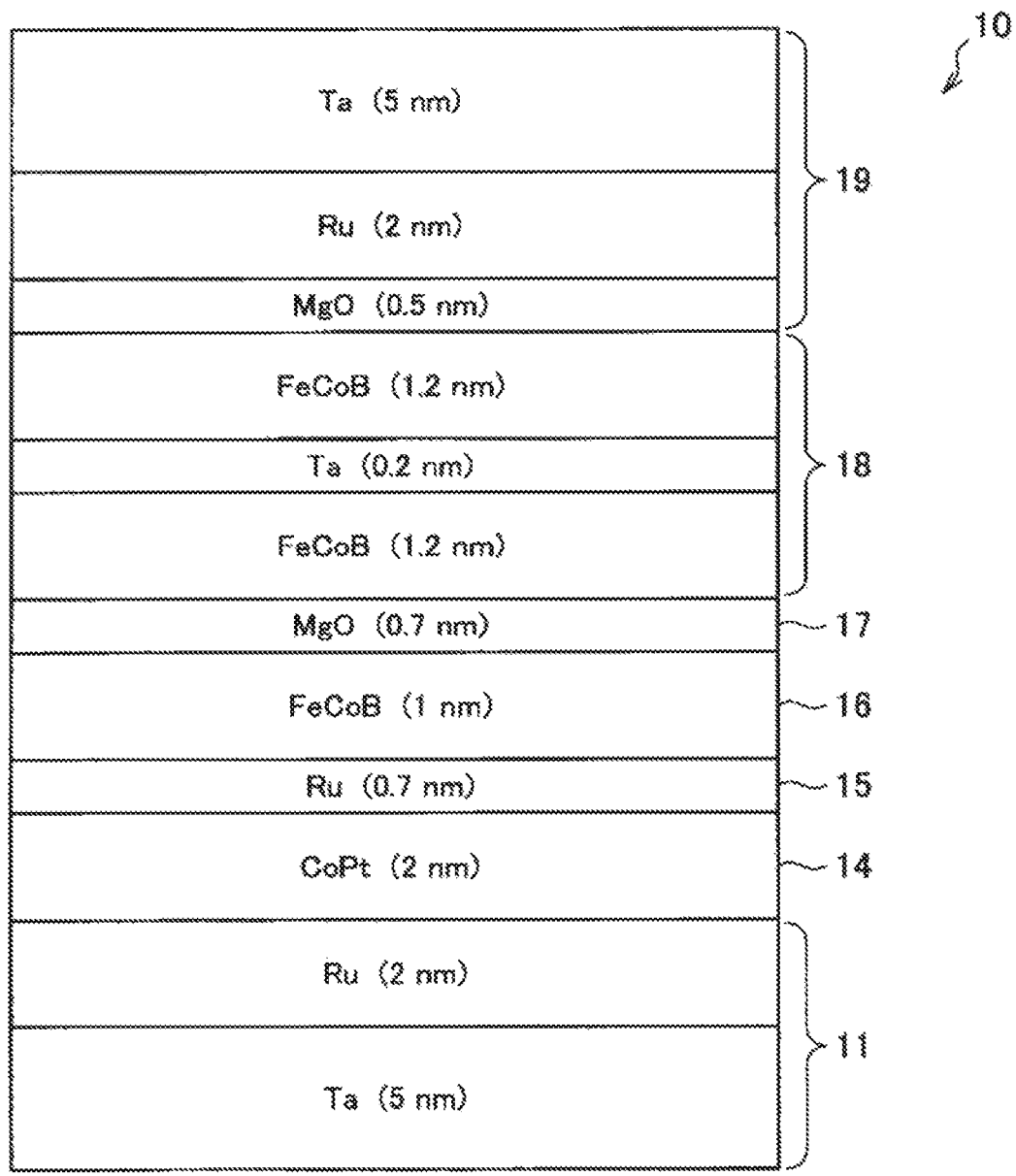

[Fig. 8]
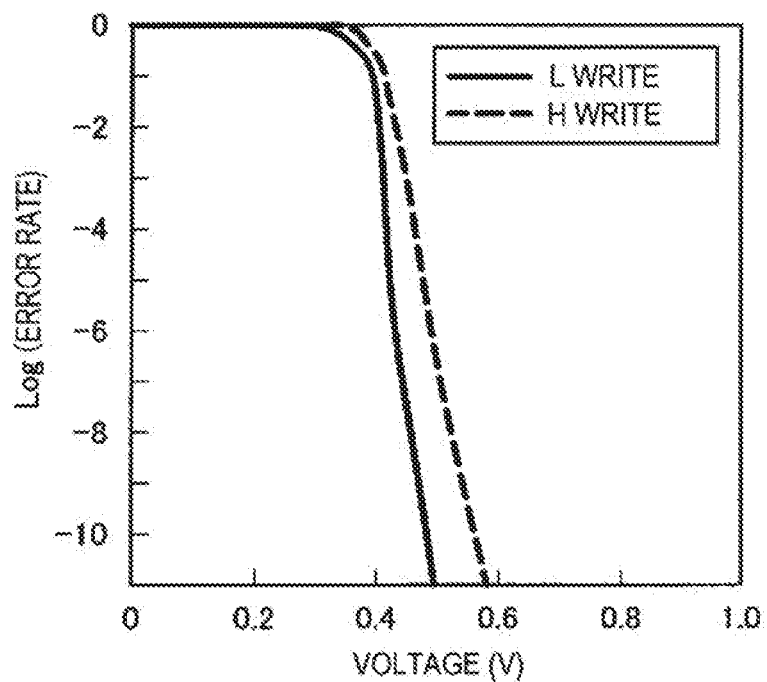
[Fig. 9]
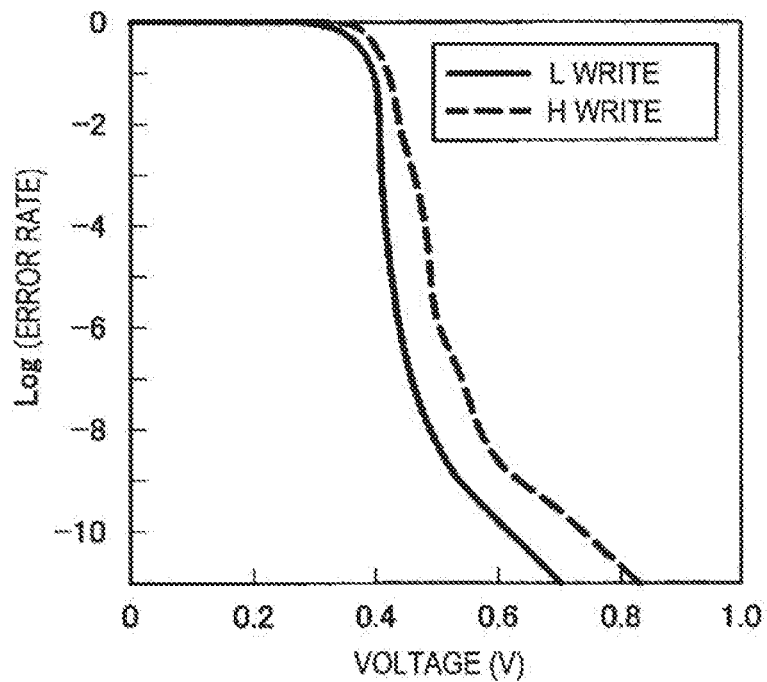

[Fig. 10]
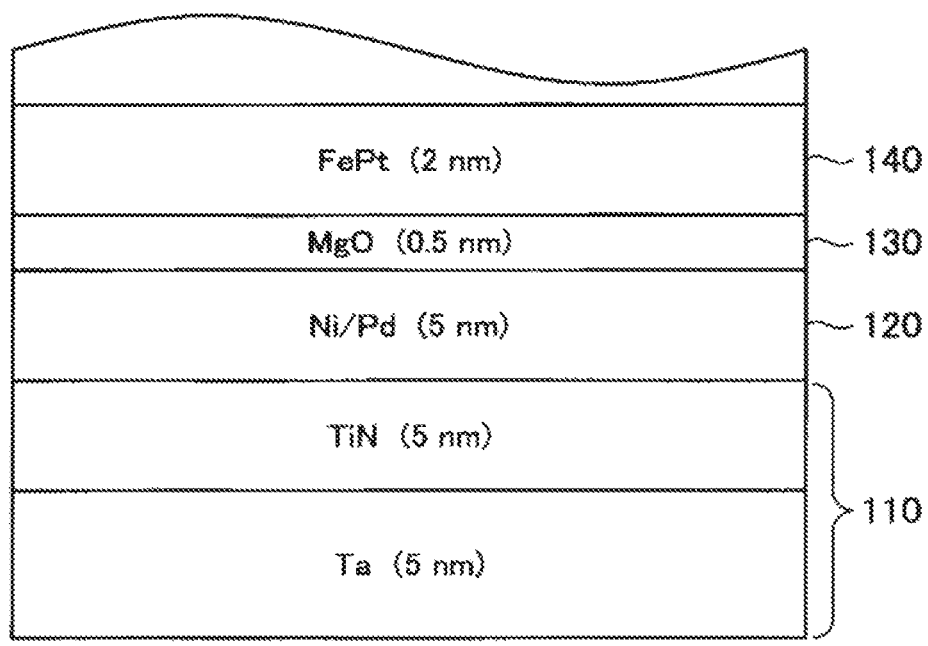
[Fig. 11]
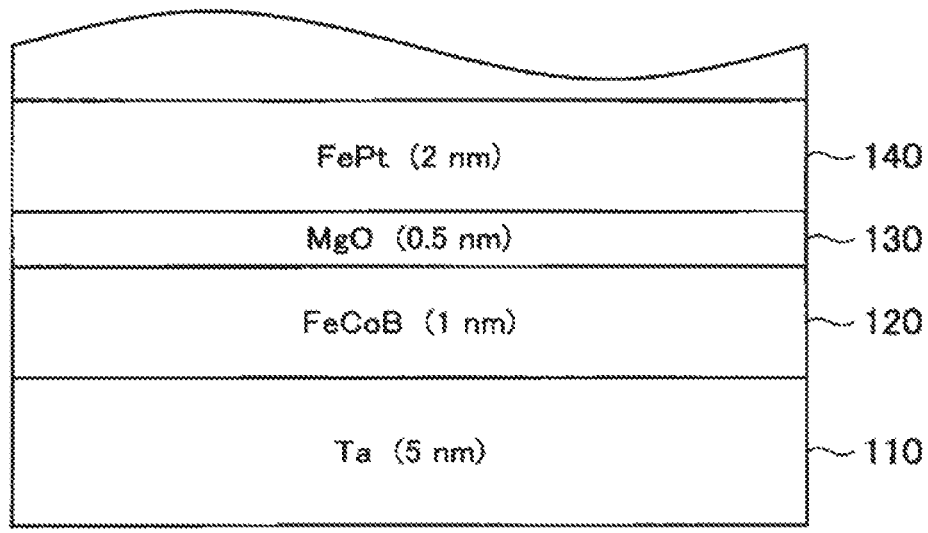

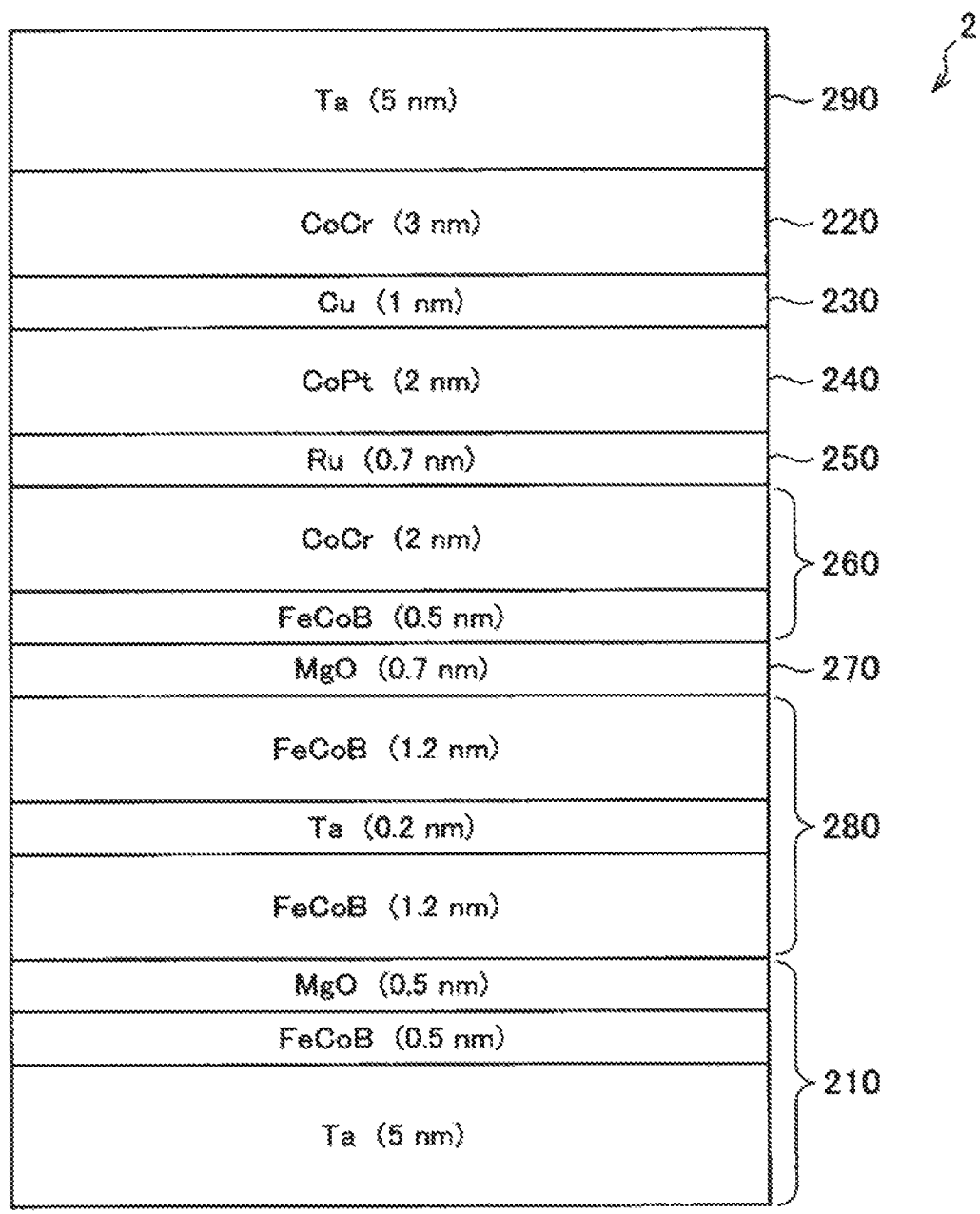
[Fig. 12]

[Fig. 13]
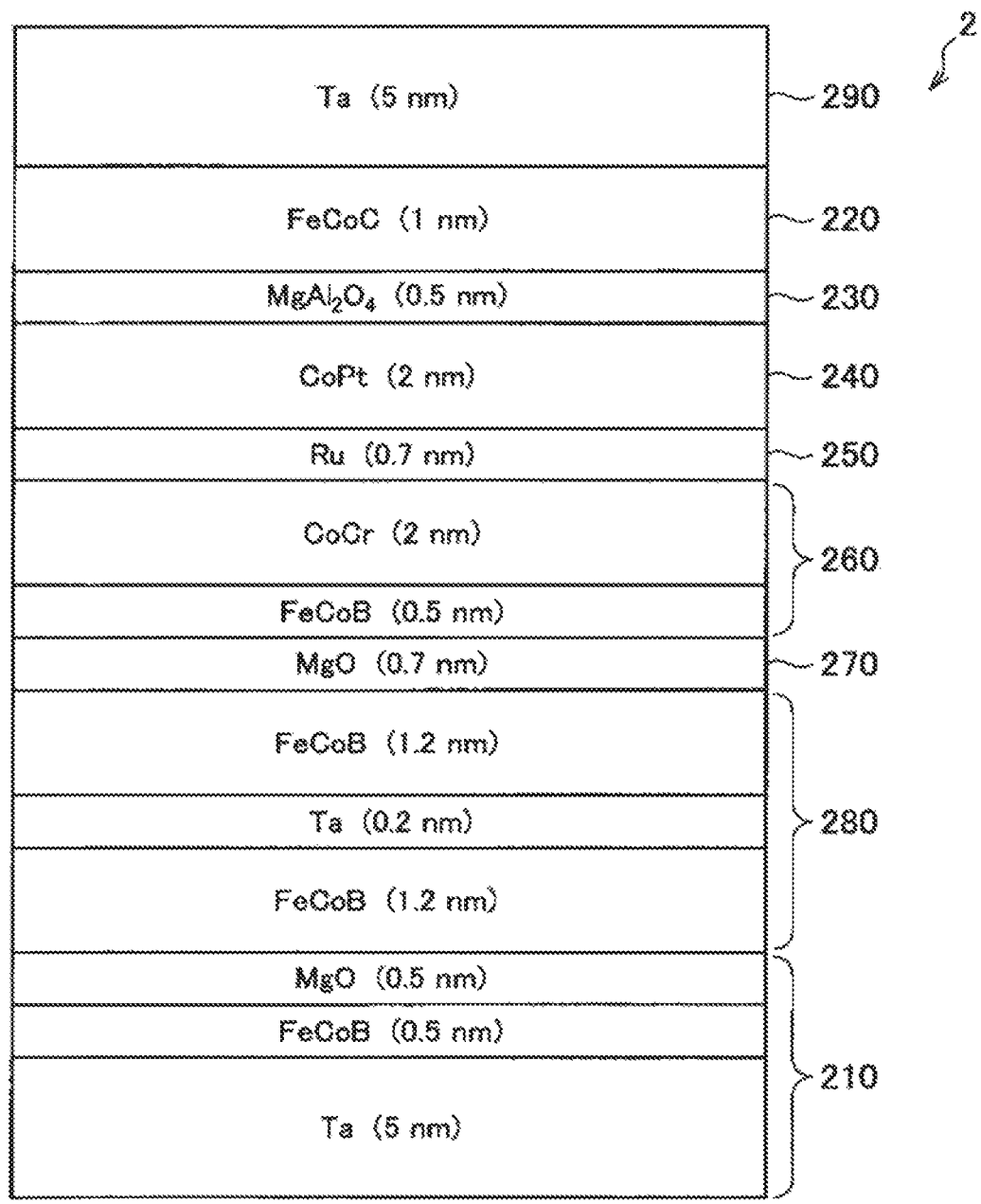

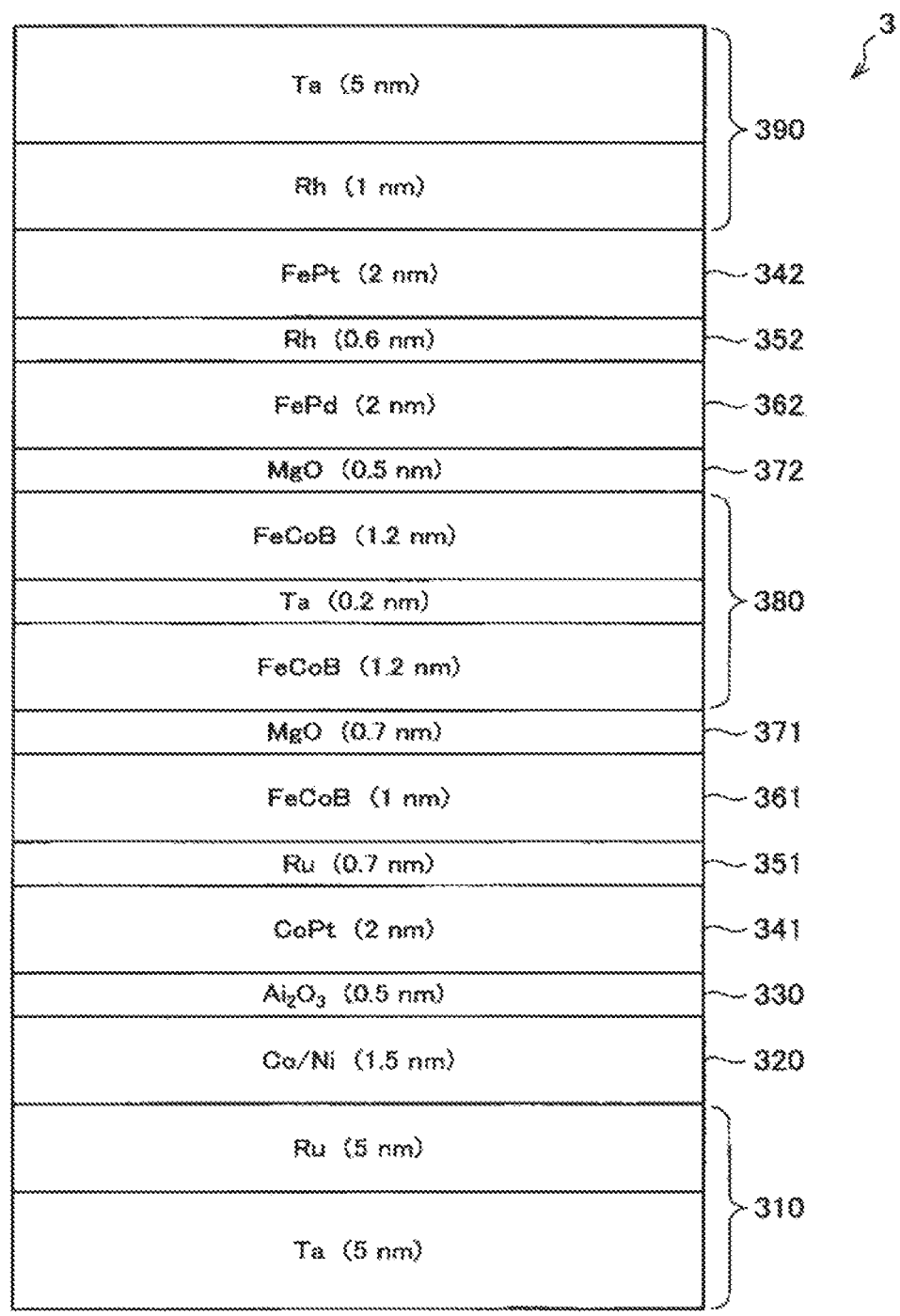
[Fig. 14]

[Fig. 15]
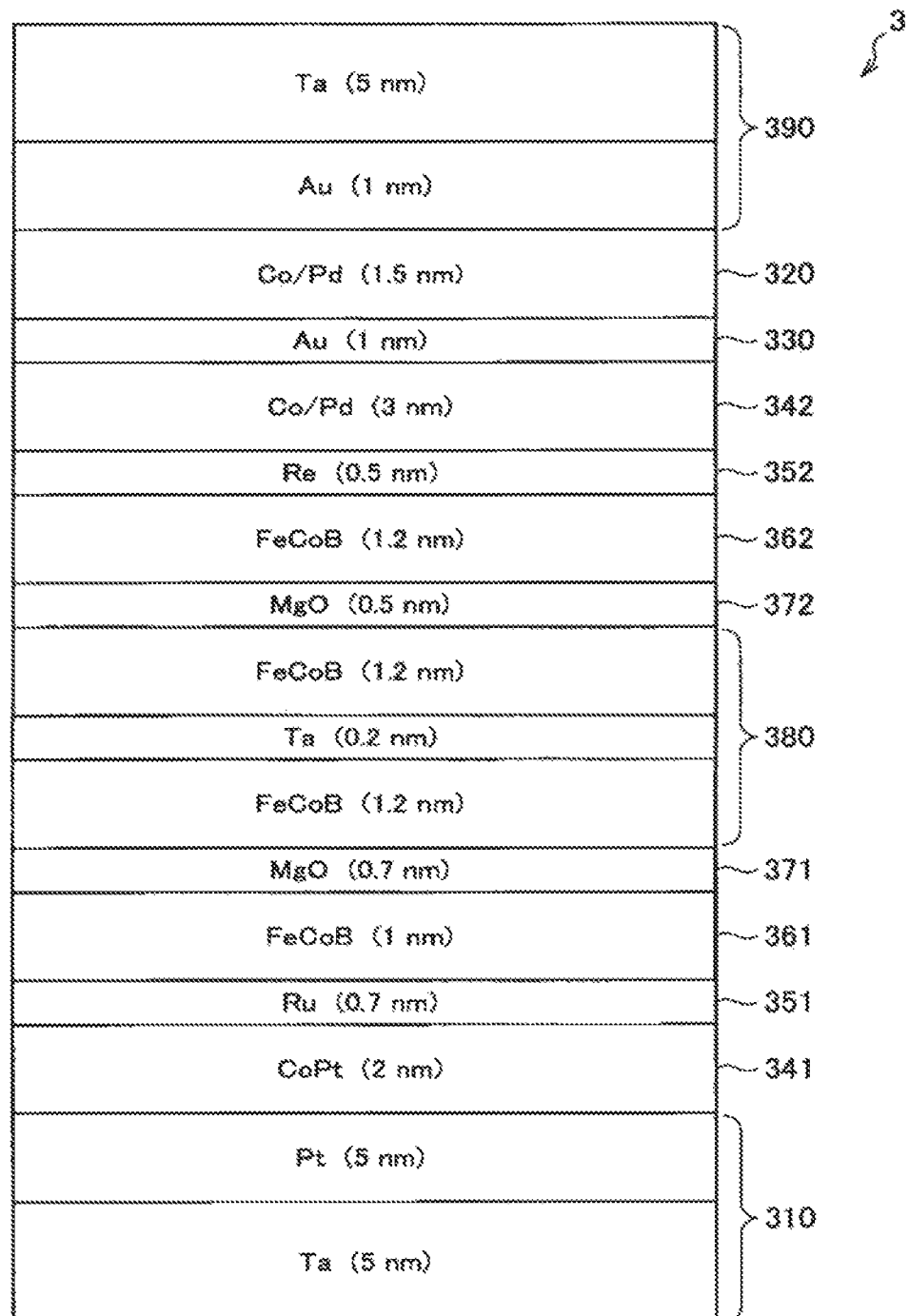

[Fig. 16]
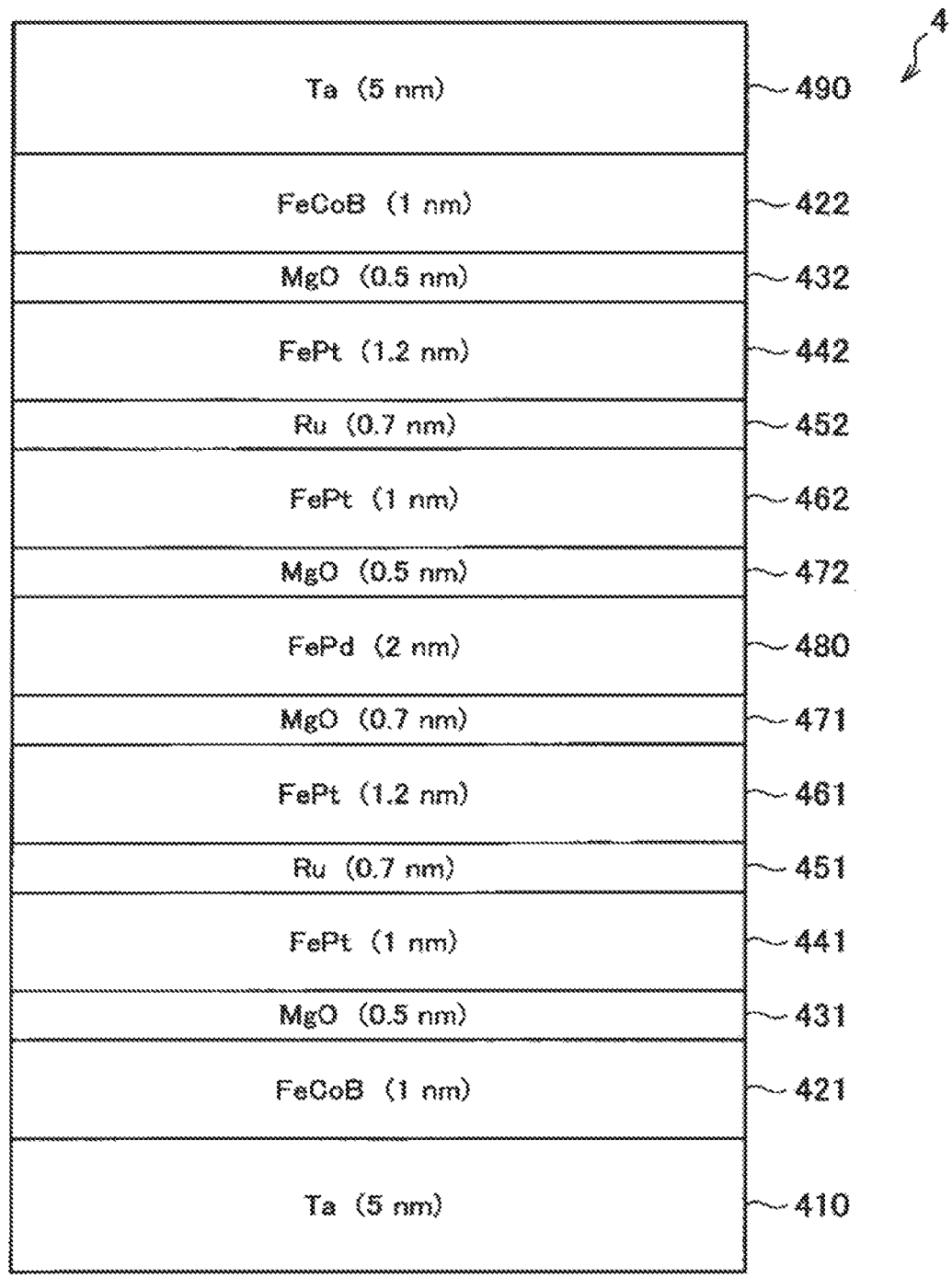

[Fig. 17]
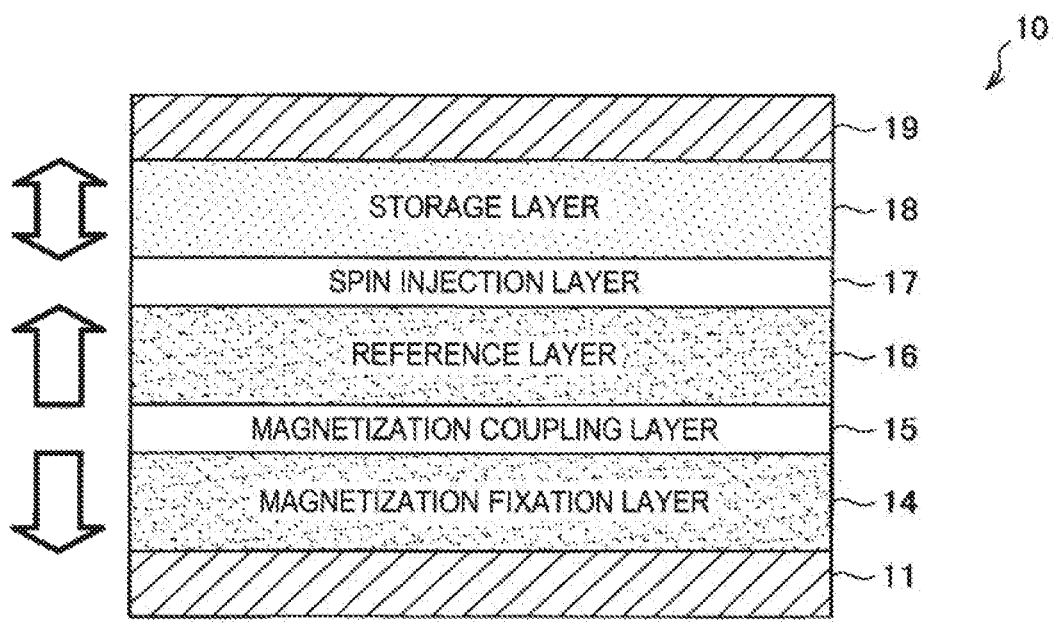
[Fig. 18]
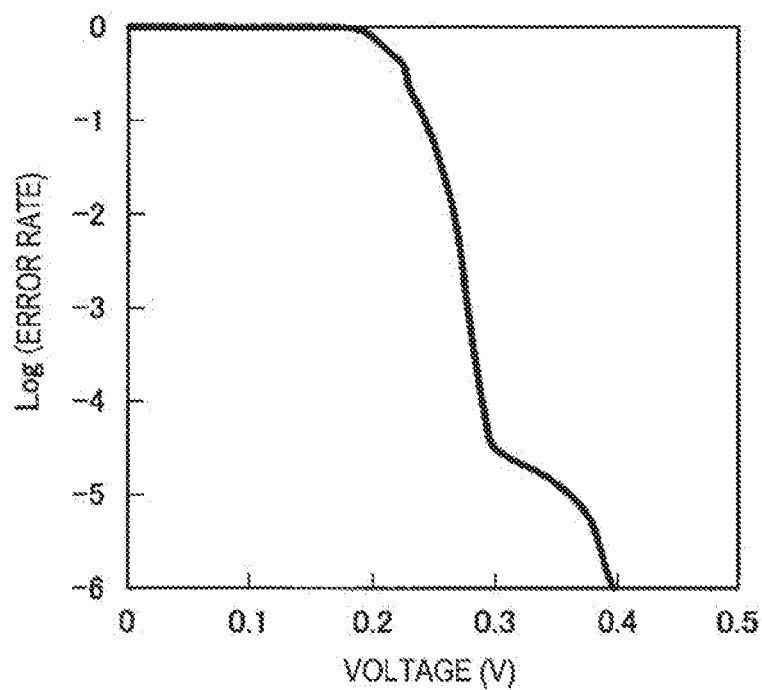

[Fig. 19A]
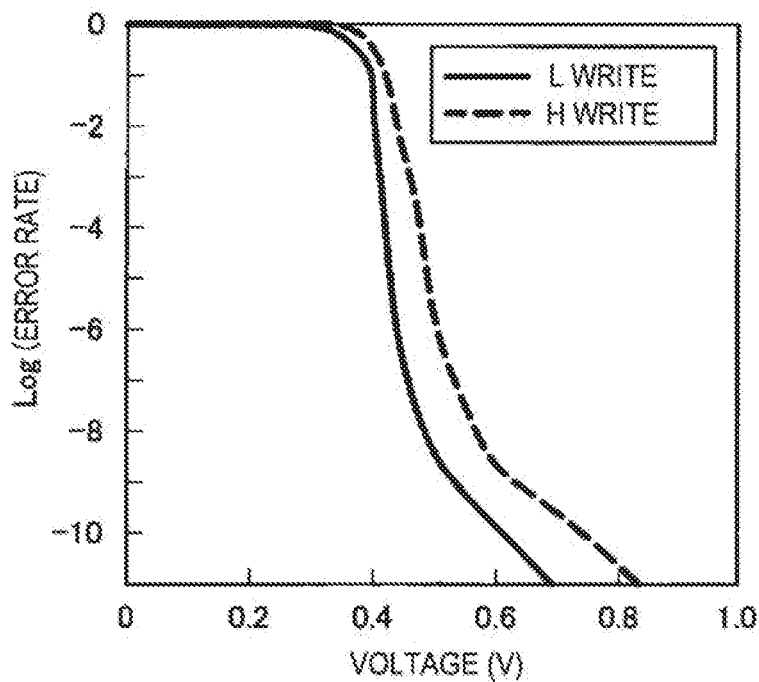
[Fig. 19B]
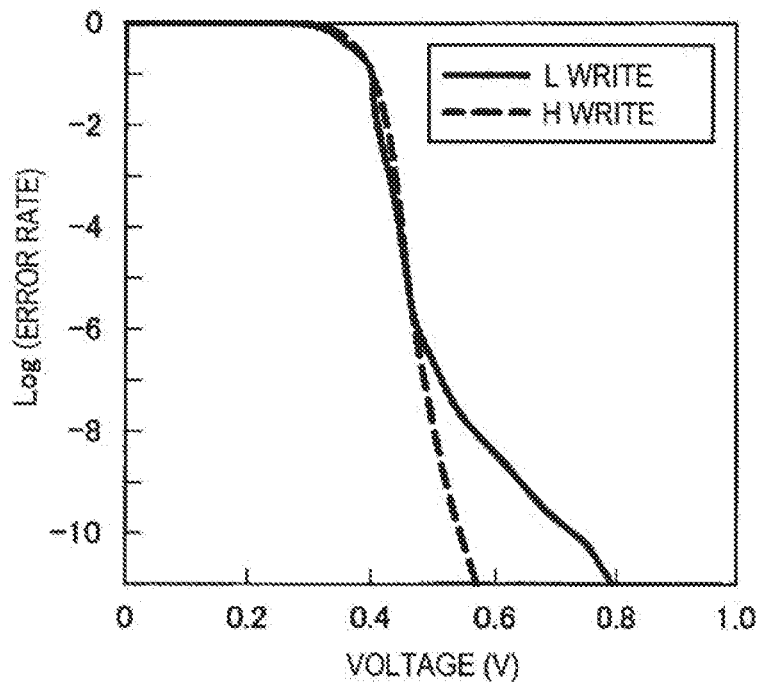

[Fig. 19C]
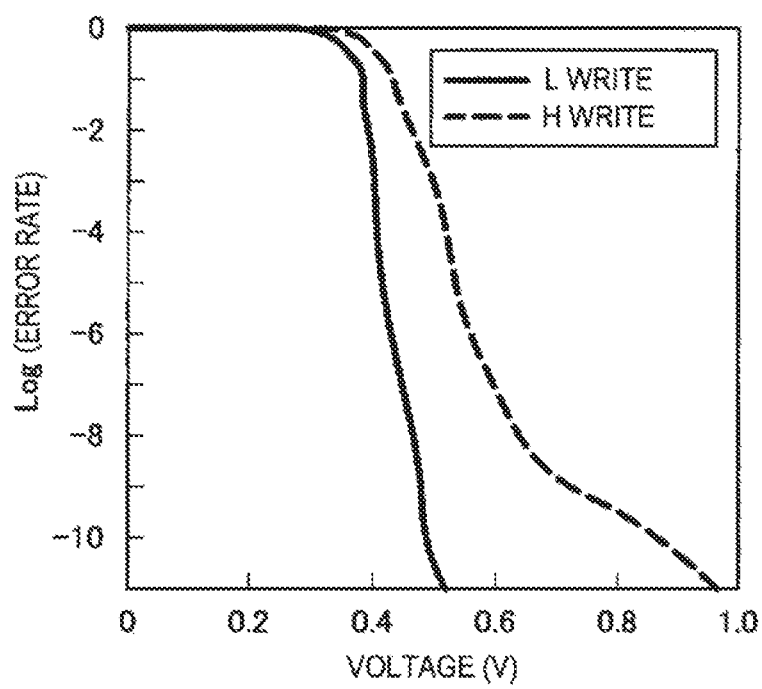

MAGNETIC STORAGE ELEMENT

CROSS REFERENCE TO RELATED APPLICATIONS

The present application is a continuation of U.S. application Ser. No. 16/091,732, filed on Oct. 5, 2018, which is a U.S. National Phase of International Application No. PCT/JP2017/009571, filed Mar. 9, 2017, which claims priority benefit of Japanese Patent Application No. 2016-084336, filed Apr. 20, 2016, the entire contents of each of which are incorporated herein by reference and relied upon.

TECHNICAL FIELD

The present disclosure relates to a magnetic storage element.

BACKGROUND ART

As performances of various types of information devices are improved in recent years, performances of storage devices and computation processing devices provided in these various types of information devices are also being improved.

For example, in non-volatile semiconductor storage elements used in the storage devices or the like, high integration, speed up, and low electric power consumption are in progress. Also, for the purpose of further performance improvement, development of various type of semiconductor storage elements, such as ferroelectric random access memory (FeRAM), phase-change random access memory (PCRAM), and magnetic random access memory (MRAM), in addition to flash memory is in progress.

The MRAM that stores information by magnetization directions of a magnetic body is capable of high speed operation, and has a high storage reliability, and thus is attracting attention as a storage element superior to the flash memory. In particular, of the MRAMs, a magnetic storage element which is referred to as a spin transfer torque-magnetic random access memory (STT-MRAM) that reverses magnetization directions of a magnetic layer by injecting a spin-polarized electron in the magnetic layer is attracting attention.

Here, in the STT-MRAM, in order to decrease write errors to improve the reliability as the storage element, an applied voltage at the time of write (i.e., electric current at the time of write) is increased, and the probability of reversing the magnetization direction of the magnetic layer is increased.

Note that, in the STT-MRAM, when the applied voltage at the time of write is a certain value or more, a phenomenon which is referred to as low probability bifurcated switching (LPBS) in which a write error rate is difficult to decrease occurs due to magnetic inhomogeneity of the magnetic body. When the LPBS occurs, a higher voltage is to be applied at the time of write in order to satisfy the write error rate necessary as the storage element, and thus electric power consumption increases at the time of write.

For example, the below Patent Literature 1 discloses signal processing of the voltage at the time of write in order to decrease the write error rate of the STT-MRAM.

CITATION LIST

Patent Literature

[PTL 1]
US Patent Application Publication No. 2014/0347918

SUMMARY

Technical Problem

However, in order to employ the technology disclosed in Patent Literature 1, it is necessary to separately add a circuit for performing signal processing of the voltage at the time of write into the magnetic storage element that configures the STT-MRAM. Hence, in the magnetic storage element that employs the technology disclosed in Patent Literature 1, the circuit size increases, and the integration degree decreases.

Thus, the present disclosure proposes a new and improved magnetic storage element that can be driven with lower electric power consumption, by reducing the LPBS, without decreasing the integration degree.

Solution to Problem

According to an embodiment of the present disclosure, there is provided a magnetic storage element including: a storage layer that has a magnetization easy axis in a perpendicular direction to a film surface, a magnetization direction of the storage layer being variable; a reference layer provided at at least one surface side of the storage layer with a non-magnetic layer in between, and having magnetization whose direction is fixed in one direction perpendicular to a film surface; a magnetization fixation layer provided at a surface side opposite to a surface of the reference layer at which the storage layer is provided, with a non-magnetic layer in between, and having magnetization whose direction is fixed in an antiparallel direction to a magnetization direction of the reference layer; and a magnetization assist layer provided at a surface side opposite to a surface of the magnetization fixation layer at which the reference layer is provided, with a non-magnetic layer in between, and having a magnetization easy axis in a perpendicular direction to a film surface, in which change in a magnetization direction is easier than in the storage layer.

According to an embodiment of the present disclosure, there is provided a magnetic storage element including: a storage layer that stores information by a magnetization direction; a reference layer whose magnetization direction is fixed, the reference layer serving as a reference for the magnetization direction of the storage layer; a magnetization fixation layer that magnetically couples with the reference layer; and a magnetization assist layer in which change in a magnetization direction is easier than in the storage layer. When information is written into the storage layer by a spin torque generated by an electric current that flows through the storage layer, the reference layer, the magnetization fixation layer, and the magnetization assist layer, the magnetization assist layer reverses magnetization in a parallel direction to the magnetization direction written into the storage layer, and applies an external magnetic field to the storage layer.

According to an embodiment of the present disclosure, when information is written, an external magnetic field parallel to the magnetization reversal direction of the storage layer is applied to the storage layer by the magnetization assist layer, thereby reducing occurrence of the LPBS that makes it difficult to decrease the write error rate.

Advantageous Effects of Invention

As described above, according to the present disclosure, the LPBS is prevented without decreasing the integration degree of magnetic storage elements, enabling driving with lower electric power consumption.

Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 1 is an explanatory diagram that schematically illustrates a stacking structure of a magnetic storage element according to an embodiment of the present disclosure.

FIG. 2A is an explanatory diagram illustrating behavior at the time of L write of a magnetic storage element according to the embodiment.

FIG. 2B is an explanatory diagram illustrating behavior at the time of H write of a magnetic storage element according to the embodiment.

FIG. 3 is an explanatory diagram that schematically illustrates a stacking structure of a magnetic storage element according to a first exemplary variant.

FIG. 4 is an explanatory diagram that schematically illustrates a stacking structure of a magnetic storage element according to a second exemplary variant.

FIG. 5 is an explanatory diagram that schematically illustrates a stacking structure of a magnetic storage element according to a third exemplary variant.

FIG. 6 is an explanatory diagram illustrating a layer structure of a magnetic storage element according to working example 1.

FIG. 7 is an explanatory diagram illustrating a layer structure of a magnetic storage element according to a comparative example.

FIG. 8 is a graph diagram that illustrates a relationship between a write error rate of a magnetic storage element according to working example 1 and an applied voltage.

FIG. 9 is a graph diagram that illustrates a relationship between a write error rate of a magnetic storage element according to a comparative example and an applied voltage.

FIG. 10 is an explanatory diagram illustrating a layer structure of a magnetic storage element according to working example 2.

FIG. 11 is an explanatory diagram illustrating a layer structure of a magnetic storage element according to working example 3.

FIG. 12 is an explanatory diagram illustrating a layer structure of a magnetic storage element according to working example 4.

FIG. 13 is an explanatory diagram illustrating a layer structure of a magnetic storage element according to working example 5.

FIG. 14 is an explanatory diagram illustrating a layer structure of a magnetic storage element according to working example 6.

FIG. 15 is an explanatory diagram illustrating a layer structure of a magnetic storage element according to working example 7.

FIG. 16 is an explanatory diagram illustrating a layer structure of a magnetic storage element according to working example 8.

FIG. 17 is an explanatory diagram that schematically illustrates a stacking structure of a magnetic storage element of an STT-MRAM.

FIG. 18 is a graph diagram illustrating a relationship between a write error rate of a magnetic storage element and an applied voltage when an LPBS occurs.

FIG. 19A is a graph diagram that illustrates a relationship between a write error rate when an external magnetic field is not applied and an applied voltage.

FIG. 19B is a graph diagram that illustrates a relationship between a write error rate when an external magnetic field is applied and an applied voltage.

FIG. 19C is a graph diagram that illustrates a relationship between a write error rate when an external magnetic field is applied and an applied voltage.

DESCRIPTION OF EMBODIMENTS

Hereinafter, (a) preferred embodiment(s) of the present disclosure will be described in detail with reference to the appended drawings. In this specification and the appended drawings, structural elements that have substantially the same function and structure are denoted with the same reference numerals, and repeated explanation of these structural elements is omitted.

Note that description will be made in the following order.
1. Background of Present Disclosure
 1.1. Technical Background of Present Disclosure
 1.2. Configuration of Magnetic Storage Element of STT-MRAM
 1.3. Study of Error Rate Characteristics at Time of Write
2. Embodiment of Present Disclosure
 2.1. Configuration of Magnetic Storage Element
 2.2. Exemplary Variant
3. Working Example of Present Disclosure
4. Conclusion 1. Background of Present Disclosure (1.1. Technical Background of Present Disclosure)

First, the technical background of the present disclosure will be described. The technology according to the present disclosure relates to a non-volatile semiconductor storage element that stores various types of information.

The non-volatile semiconductor storage element is making marked advance as represented by a flash memory, and its development is in progress with such a momentum as to expel storage devices other than the semiconductor storage element, such as a hard disk drive (HDD) device. Also, there is a study to develop a storage device composed of non-volatile semiconductor storage elements into a code storage that stores programs, calculation parameters and the like, and a working memory that temporarily stores parameters that change as appropriate during execution of a program and the like, in addition to a data storage.

Although a NOR or NAND flash memory represents this non-volatile semiconductor storage element as described above, a FeRAM that stores information by remnant polarization of ferroelectric, a PCRAM that stores information by phase states of a phase-change film, and an MRAM that stores information by magnetization directions of a magnetic body, and the like are developed as well.

In particular, the MRAM stores information by magnetization directions of a magnetic body, and thus can perform rewrite of the information at a high speed and almost without limitation. Hence, the MRAM is under intensive development, and is partially put into practical use in fields such as an industrial automation device and a plane.

Note that, of MRAMs, an MRAM that reverses magnetization of the magnetic body by an electric current magnetic field generated from a line has difficulty in reducing electric power consumption and making the capacity larger, due to the above method of reversing magnetization. This is because, in order to generate the electric current magnetic field of the intensity that can reverse the magnetization of the magnetic body, an electric current of approximately several mA is necessary, and the electric power consumption at the time of write increases. Also, it is necessary to prepare a line that generates an electric current magnetic field for each magnetic storage element, and there is a limitation to size reduction of the magnetic storage element.

Thus, there is a study of an MRAM that can reverse the magnetization of the magnetic body by a method other than using the electric current magnetic field from the line. Specifically, there is a study of an MRAM that reverses the magnetization of the magnetic body by using spin torque magnetization reversal.

The spin torque magnetization reversal is a magnetization reversal method that, when a spin-polarized electron that has passed through a magnetic body having a magnetic moment fixed to a predetermined direction enters another magnetic body, imparts a torque to the magnetic moment of the entered magnetic body. Thereby, the magnetic moment of the magnetic body, in which the electric current (i.e., the spin-polarized electron) equal to or larger than a threshold value flows and to which the torque equal to or larger than a threshold value is imparted, reverses in the direction parallel to the imparted torque. Note that the reversal direction of the magnetic moment is controllable by changing the polarity of the electric current that flows in the magnetic body.

Here, the absolute value of the electric current necessary to generate the spin torque magnetization reversal is approximately 100 μA or less for the magnetic storage element of the size of approximately 50 nm, and decreases as the volume of the magnetic storage element becomes smaller. On the other hand, when the magnetization of the magnetic body is reversed by using the electric current magnetic field generated from the line, the electric current necessary for the magnetization reversal is approximately several mA. Thus, the MRAM that uses the spin torque magnetization reversal (also referred to as STT-MRAM) can make the electric current at the time of the write extremely smaller than the MRAM that uses the magnetization reversal by the electric current magnetic field from the line, and thereby is capable of operating with low electric power consumption.

Also, the line, such as a word line, that generates the electric current magnetic field is necessary in the MRAM that uses the magnetization reversal by the electric current magnetic field from the line, but this line becomes unnecessary in the STT-MRAM. Hence, the STT-MRAM can reduce the size of each magnetic storage element as compared to the MRAM that uses the magnetization reversal by the electric current magnetic field from the line, and thereby can make the capacity larger.

Thus, the STT-MRAM can make the electric power consumption lower and the capacity larger, while maintaining the characteristics of the MRAM that can rewrite information at a high speed and almost without a limitation, and thus is attracting considerable attention as a high-performance non-volatile semiconductor storage element.

(1.2. Configuration of Magnetic Storage Element of STT-MRAM)

Next, with reference to FIG. 17, a structure of each magnetic storage element of the STT-MRAM that uses the spin torque magnetization reversal described above will be described. FIG. 17 is an explanatory diagram that schematically illustrates a stacking structure of a magnetic storage element of the STT-MRAM.

As illustrated in FIG. 17, a magnetic storage element 10 of the STT-MRAM includes a first electrode layer 11, a magnetization fixation layer 14, a magnetization coupling layer 15, a reference layer 16, a spin injection layer 17, a storage layer 18, and a second electrode layer 19.

The magnetic storage element 10 is one storage element that stores one piece of information (0 or 1). Address lines (i.e., a word line and a bit line) orthogonal to each other are provided above and below the magnetic storage element 10, and the magnetic storage element 10 is connected to the word line and the bit line near the intersection point of the lines.

Specifically, in the magnetic storage element 10, the first electrode layer 11 and the word line are connected, and the second electrode layer 19 and the bit line are connected, via a selection transistor or the like. Thereby, in the magnetic storage element 10 selected by the selection transistor, voltage is applied between the first electrode layer 11 and the second electrode layer 19 via the word line and the bit line, to perform rewrite and readout of the information stored in the storage layer 18. Note that, in FIG. 17, the word line, the bit line, and the selection transistor are not depicted.

Note that FIG. 17 has illustrated a structure in which the spin injection layer 17, the reference layer 16, the magnetization coupling layer 15, and the magnetization fixation layer 14 are stacked in the downward direction with respect to the storage layer 18, as the stacking structure of the magnetic storage element 10, but the magnetic storage element 10 is not limited to this structure. The magnetic storage element 10 may have a structure in which the spin injection layer 17, the reference layer 16, the magnetization coupling layer 15, and the magnetization fixation layer 14 are stacked in the upward direction with respect to the storage layer 18.

The storage layer 18 is formed of a magnetic body including ferromagnetic material, and stores information by magnetization directions of the magnetic body. Also, the magnetization easy axis of the storage layer 18 is in the perpendicular direction to the film surface, and the storage layer 18 is provided such that the magnetization direction is variable. The storage layer 18 may be a single layer, and may be stacked layers of non-magnetic layers and magnetic layers, and may be stacked layers of oxide layers and magnetic layers.

The reference layer 16 is formed of a magnetic body including ferromagnetic material, and is provided at one surface side of the storage layer 18 with the spin injection layer 17 in between. The magnetization direction of the reference layer 16 is fixed in one direction (in FIG. 17, the direction from the first electrode layer 11 toward the second electrode layer 19), and functions as a reference for the magnetization direction retained in the storage layer 18.

The spin injection layer 17 is formed of non-magnetic material, and is provided and sandwiched between the storage layer 18 and the reference layer 16. The spin injection layer 17 exchanges a spin-polarized electron with the storage layer 18 and the reference layer 16 at the time of write of information into the storage layer 18, and thereby imparts a spin torque to the storage layer 18 and reverses the magnetization direction of the storage layer 18.

Also, the spin injection layer 17 changes the electrical resistance on the basis of the magnetization direction of each of the storage layer 18 and the reference layer 16 by magnetoresistance effect, at the time of readout of information from the storage layer 18. Thus, the magnetic storage element 10 can read out the information stored in the storage layer 18, by measuring the electrical resistance between the first electrode layer 11 and the second electrode layer 19.

The magnetization fixation layer 14 is formed of a magnetic body including ferromagnetic material, and is provided at the surface side opposite to the surface of the reference layer 16 on which the spin injection layer 17 is provided, with the magnetization coupling layer 15 in between. The magnetization fixation layer 14 has magnetization fixed in the direction (in FIG. 17, the direction from the second electrode layer 19 toward the first electrode layer 11) antiparallel to the magnetization of the reference layer 16, and cancels a leak magnetic field from the reference layer 16 by magnetically coupling with the reference layer 16. Thereby, the magnetization fixation layer 14 can reduce the magnetic influence from the reference layer 16 to the storage layer 18.

The magnetization coupling layer 15 is formed of non-magnetic material, and is provided and sandwiched between the reference layer 16 and the magnetization fixation layer 14. The magnetization coupling layer 15 can stabilize the magnetization direction of the reference layer 16 by magnetically coupling the reference layer 16 and the magnetization fixation layer 14, and improve retention characteristics of the magnetization direction of the reference layer 16.

Note that the ferromagnetic material included in the storage layer 18, the reference layer 16, and the magnetization fixation layer 14 is, for example, amorphous perpendicular magnetization material such as TbFeCo and GdFeCo, magnetic material having crystal magnetic anisotropy such as CoPt and FePt, or alloy magnetic material of at least one or more selected from among Fe, Co, and Ni and at least one or more selected from among B and C.

The first electrode layer 11 and the second electrode layer 19 are provided to sandwich the magnetization fixation layer 14, the magnetization coupling layer 15, the reference layer 16, the spin injection layer 17, and the storage layer 18.

The first electrode layer 11 functions as a lower electrode of the magnetic storage element 10, and is formed of various types of metal materials or alloy materials. Also, the first electrode layer 11 may control the crystal orientation of the magnetization fixation layer 14 that is stacked on the first electrode layer 11. For example, the first electrode layer 11 may be formed of metal material whose crystal orientation and magnetic anisotropy are substantially identical with the magnetization fixation layer 14. Also, the second electrode layer 19 functions as an upper electrode of the magnetic storage element 10, and is formed of various types of metals or alloys. Also, the second electrode layer 19 may function as a protection layer of the magnetic storage element 10.

Next, a scheme of write and readout of information in the magnetic storage element 10 will be described.

First, the scheme of readout of information in the magnetic storage element 10 will be described. In the magnetic storage element 10, readout of information from the storage layer 18 is performed by using the magnetoresistance effect.

Specifically, when the electric current is flowed between the first electrode layer 11 and the second electrode layer 19, the electrical resistance of the spin injection layer 17 changes on the basis of whether the magnetization directions of the storage layer 18 and the reference layer 16 are in a parallel state or in an antiparallel state. Thereby, the information stored in the storage layer 18 can be read out by detecting the value of the electrical resistance indicated by the magnetic storage element 10.

Next, the scheme of write of information in the magnetic storage element 10 will be described. In the magnetic storage element 10, write of information into the storage layer 18 is performed by using spin torque magnetization reversal. In the following, the spin torque magnetization reversal will be described with a focus on the storage layer 18, the reference layer 16, and the spin injection layer 17.

First, the electron can take two different spin angular momenta, which are provisionally defined as an upward direction and a downward direction respectively. Thus, the electrons in the upward direction and the electrons in the downward direction are of the same number in a non-magnetic body, and a difference is generated between the number of electrons in the upward direction and the number of electrons in the downward direction in a ferromagnetic body.

Here, a case is considered in which an electron is moved from the reference layer 16 to the storage layer 18, in the storage layer 18 and the reference layer 16 whose magnetization directions are antiparallel to each other. In the reference layer 16, the magnetic moment is fixed by the magnetic coupling with the magnetization fixation layer 14, and thus the electrons that have passed through the reference layer 16 generate a difference between the number of electrons in the upward direction and the number of electrons in the downward direction (also referred to as spin polarization) in the same polarization direction as the magnetic moment of the reference layer 16.

When the spin injection layer 17 is formed sufficiently thin, the electrons that have passed through the reference layer 16 enter the storage layer 18, before the spin polarization is relaxed and the electrons in the upward direction and the electrons in the downward direction become the same number (also referred to unpolarized state).

The storage layer 18 has an inversed spin polarization direction to the entered electrons. Thus, the energy of the entire system is reduced, and thus a part of the entering electrons reverses the direction of the spin angular momentum. Note that the spin angular momentum is conserved in the entire system, and thus counteraction equivalent to total change of the spin angular momenta of the reversed electrons is added to the magnetic moment of the storage layer 18.

When the electric current that flows in the reference layer 16 and the storage layer 18 is small, the number of electrons per unit time that enters the storage layer 18 is also small, and thus the total spin angular momentum added to the magnetic moment of the storage layer 18 is also small. However, as the electric current amount that flows in the reference layer 16 and the storage layer 18 increases, the total spin angular momentum per unit time added to the magnetic moment of the storage layer 18 becomes larger. Then, when the torque, which is the temporal change of the angular momentum, exceeds a threshold value, the magnetic moment of the storage layer 18 starts a precessional motion, and thereafter becomes stabilized in a state in which the magnetic moment is reversed by 180°. Note that the magnetic moment of the storage layer 18 is stabilized in the state in which the magnetic moment is reversed by 180°, because the magnetic body that configures the storage layer 18 has a magnetization easy axis, and has uniaxial anisotropy.

With the above scheme, the magnetization direction of the storage layer 18 is reversed to a parallel state, from the antiparallel state to the reference layer 16. Thus, in the magnetic storage element 10, the magnetization direction of the storage layer 18 whose magnetization direction is antiparallel to the reference layer 16 can be reversed by flowing the electric current from the storage layer 18 to the reference layer 16 and injecting the electrons into the storage layer 18 from the reference layer 16.

On the other hand, when the magnetization direction of the storage layer 18 whose magnetization direction is parallel to the reference layer 16 is reversed, the electrons are injected into the reference layer 16 from the storage layer 18, by flowing the electric current from the reference layer 16 to the storage layer 18. In this case, the electrons that enter the reference layer 16 are reflected at the reference layer 16, and thereby the electrons reverse the spin and enter into the storage layer 18 again. Thereby, the magnetic moment of the storage layer 18 receives torque from the electrons whose spins are reversed by the reflection at the reference layer 16, and thus when the torque exceeds a threshold value, the magnetic moment of the storage layer 18 reverses in an antiparallel direction to the reference layer 16.

Note that the electric current amount necessary to reverse the magnetization direction of the storage layer 18 that has the magnetization direction parallel to the reference layer 16 becomes larger than when reversing the magnetization direction of the storage layer 18 that has the antiparallel magnetization direction. In the following, for convenience, the write that reverses the magnetization of the storage layer 18 parallel to the magnetization direction of the reference layer 16 is referred to as "H write" because the necessary electric current amount is large, and the write that reverses the magnetization of the storage layer 18 antiparallel to the magnetization direction of the reference layer 16 is referred to as "L write".

As described above, in the magnetic storage element 10, the write of the information into the storage layer 18 is performed by flowing the electric current equal to or larger than a threshold value corresponding to the polarity of the electric current, in the storage layer 18, the spin injection layer 17, and the reference layer 16.

In more detail, the threshold value $Ic_0$ of the electric current (also referred to as reversal electric current) necessary to reverse the magnetization of the storage layer 18 by the spin torque magnetization reversal is expressed by the following equation 1A and equation 1B, when the magnetization easy axis of the storage layer 18 is directed in the perpendicular direction to the film surface. Note that equation 1A is the equation when the magnetization of the storage layer 18 is parallel to the magnetization direction of the reference layer 16, and equation 1B is the equation when the magnetization of the storage layer 18 is antiparallel to the magnetization direction of the reference layer 16.

[Math. 1]

$$Ic_0 = (A \cdot \alpha \cdot Ms \cdot V/g(0)/P)Hk \qquad \text{equation 1A}$$

$$Ic_0 = -(A \cdot \alpha \cdot Ms \cdot V/g(\pi)/P)Hk \qquad \text{equation 1B}$$

In the above equation 1A and equation 1B, A is a constant; $\alpha$ is a dumping constant; Ms is saturation magnetization; V is the volume of the storage layer 18; P is a spin polarizability; $g(0)$ and $g(\pi)$ are coefficients for the efficiency of transferal of the spin torque transferred to the storage layer 18 in the parallel or antiparallel case; and Hk is an effective anisotropic magnetic field.

Also, the reversal electric current $Ic_0$ can be expressed by the following equation 2 in the relationship with the index $\Delta$ of the thermal stability of the magnetic body.

[Math. 2]

$$Ic_0 = \left(\frac{4ek_BT}{h}\right)\left(\frac{\alpha\Delta}{\eta}\right) \qquad \text{equation 2}$$

In the above equation 2, e is an electric charge of electron; q is a spin injection efficiency; h is a reduced Planck constant; $\alpha$ is a dumping constant; $k_B$ is a Boltzmann constant; and T is a temperature. Also, the index $\Delta$ of the thermal stability of the magnetic body is expressed by the following equation 3.

[Math. 3]

$$\Delta = KV/k_BT = Ms \cdot V \cdot H_k \cdot (1/2 \cdot k_gT) \qquad \text{equation 3}$$

In the above equation 3, Hk is an effective perpendicular magnetic anisotropy; $k_B$ is a Boltzmann constant; T is a temperature; Ms is a saturation magnetization; V is the volume of the storage layer 18; and K is anisotropic energy. Note that the effective anisotropic magnetic field $H_k$ includes influence of magnetic shape anisotropy, induced magnetic anisotropy, and crystal magnetic anisotropy, but the anisotropic magnetic field $H_k$ is equivalent to coercivity, assuming the magnetization reversal of the storage layer 18 as a coherent rotation model of single magnetic domain.

In the magnetic storage element that stores information by the magnetization directions of the magnetic body, it is important to simultaneously achieve the index $\Delta$ of the thermal stability and the reversal electric current $Ic_0$ which is the threshold value of the magnetization reversal. That is, in the magnetic storage element, it is necessary to make the threshold value of the magnetization reversal lower, while making the thermal stability higher. According to the above equations, the magnetic storage element 10, which is the STT-MRAM, can set the reversal electric current to approximately several ten to several hundred μA, even when sufficient thermal stability is ensured in the storage layer 18 having a flat circular shape of diameter 50 nm and a thickness of 2 nm.

Thus, the magnetic storage element 10 that uses the spin torque magnetization reversal can make the electric current at the time of write smaller than the magnetic storage element that uses the magnetization reversal by the electric current magnetic field, and thereby can operate with low electric power consumption. Also, the magnetic storage element 10 that uses the spin torque magnetization reversal is needless to have the line for generating the electric current magnetic field as compared to the magnetic storage element that uses the magnetization reversal by the electric current magnetic field, and can make the size of the element smaller, and thus can make the capacity larger.

(1.3. Study of Error Rate Characteristics at Time of Write)

Next, the error rate characteristics at the time of write in the magnetic storage element 10 which is the STT-MRAM will be described with reference to FIGS. 18 to 19C.

In the magnetic storage element 10 that uses the spin torque magnetization reversal to write the information, the reversal of the magnetization of the storage layer 18 occurs with a probability according to the size of the voltage (i.e., the electric current) that is applied to the magnetic storage element 10. Thus, in the magnetic storage element 10, the proportion (write error rate) of the write error, which is a write failure of the information into the storage layer 18, is predicted to decrease with the increase of the applied voltage.

Here, the degree of decrease of the write error rate in relation to the applied voltage becomes more gradual as the pulse width of the signal used in the write of the information becomes shorter. Thus, when the short pulse signal is used in the storage of the information, it is necessary to make the applied voltage higher to achieve sufficiently low write error rate.

Also, when the signal used in the write of the information is a short pulse, a phenomenon which is referred to as low probability bifurcated switching (LPBS) in which the write error rate irregularly decreases in relation to the applied voltage occurs in some cases, due to the magnetic inhomogeneity of the magnetic storage element 10. When the LPBS occurs, the write error rate decreases more gradually in relation to the applied voltage, and thus it is necessary to make the applied voltage higher to achieve a sufficiently low write error rate.

A representative relationship between the write error rate of the magnetic storage element 10 and the applied voltage when the LPBS occurs is illustrated in FIG. 18. FIG. 18 is a graph diagram illustrating the relationship between the write error rate of the magnetic storage element 10 and the applied voltage when the LPBS occurs. Note that FIG. 18 is in the case of H write, and the pulse width of the write signal is approximately 15 ns.

In the magnetic storage element 10, the write error rate decreases with the increase of the applied voltage, as illustrated in FIG. 18. However, the decrease of the write error rate becomes gradual in relation to the increase of the applied voltage, from a boundary at the applied voltage near 0.3V.

This LPBS occurs due to the magnetic inhomogeneity of the magnetic storage element 10, and thus does not occur at all magnetic storage elements, but occurs at a non-negligible frequency in the storage device that integrates a large number of magnetic storage elements 10. Also, the occurrence frequency of the LPBS tends to increase under a low temperature environment. Thus, when the use temperature condition is made wider, higher write voltage is necessary to achieve a sufficient write error rate as the storage device, resulting in increase of the electric power consumption.

The inventors of the technology according to the present disclosure have studied the LPBS that occurs in the magnetic storage element 10 of the STT-MRAM, and as a result have found that the occurrence of the LPBS in the magnetic storage element 10 changes by the external magnetic field.

Specifically, the inventors have found that, when the external magnetic field parallel to the magnetization direction to be reversed is applied to the storage layer 18, the occurrence of the LPBS is reduced, and the decrease of the write error rate does not become gradual. Also, the inventors have found that, when the external magnetic field antiparallel to the magnetization direction to be reversed is applied to the storage layer 18, the influence of the LPBS increases, and the decrease of the write error rate becomes more gradual.

The above knowledge will be described more specifically, with reference to FIGS. 19A to 19C. FIGS. 19A to 19C are graph diagrams that illustrate a relationship between the write error rate when the write is repeatedly performed $10^6$ times into the magnetic storage element 10 of 1 Mbit and the applied voltage.

Note that FIG. 19A is a result when the external magnetic field is not applied, and FIG. 19B is a result when the external magnetic field of approximately 15900 A/m (200 Oe) is applied in the reversal direction of the magnetization of the H write, and FIG. 19C is a result when the external magnetic field of approximately 15900 A/m (200 Oe) is applied in the reversal direction of the magnetization of the L write.

As illustrated in FIG. 19A, in the magnetic storage element 10, the LPBS occurs with the increase of the applied voltage, and the decrease of the write error rate is gradual, in both of the H write and the L write.

However, as illustrated in FIGS. 19B and 19C, the occurrence of the LPBS is reduced, when the external magnetic field is applied to the magnetic storage element 10, and when the direction of the external magnetic field is parallel to the direction of the magnetization reversal of the storage layer 18.

Specifically, as illustrated in FIG. 19B, the tendency of the decrease of the write error rate does not change in the H write, when the external magnetic field parallel to the magnetization reversal direction of the H write is applied to the storage layer 18. Also, as illustrated in FIG. 19C, the tendency of the decrease of the write error rate does not change in the L write, when the external magnetic field parallel to the magnetization reversal direction of the L write is applied to the storage layer 18.

On the other hand, as in the L write in FIG. 19B and the H write in FIG. 19C, the decrease of the write error rate becomes more gradual, when the external magnetic field antiparallel to the magnetization reversal direction of the storage layer 18 is applied.

That is, according to the above knowledge, the magnetic storage element 10 can reduce the occurrence of the LPBS, by applying the external magnetic field according to the magnetization reversal direction of the storage layer 18 to the storage layer 18 at the time of the write to the storage layer 18. The inventors of the technology according to the present disclosure have reached the accomplishment of the technology according to the present disclosure, on the basis of the above knowledge. In the following, the technology according to the present disclosure that can reduce the influence on the write error rate by the LPBS in the STT-MRAM will be described in detail.

2. Embodiment of Present Disclosure (2.1. Configuration of Magnetic Storage Element)

First, a configuration of a magnetic storage element according to an embodiment of the present disclosure will be described with reference to FIG. 1. FIG. 1 is an explanatory diagram that schematically illustrates a stacking structure of a magnetic storage element 1 according to the present embodiment.

As illustrated in FIG. 1, the magnetic storage element 1 includes a first electrode layer 110, a magnetization assist layer 120, a non-magnetic layer 130, a magnetization fixation layer 140, a magnetization coupling layer 150, a reference layer 160, a spin injection layer 170, a storage layer 180, and a second electrode layer 190.

The magnetic storage element 1 is a STT-MRAM that stores information by the magnetization directions of the magnetic body, as described in the background of the present disclosure. Also, the magnetic storage element 1 is connected to the address lines that are orthogonal to each other, and is integrated to form an array, and thereby can configure a storage device that stores large capacity information.

The storage layer 180 is formed of ferromagnetic material in such a manner that the magnetization easy axis is directed in the perpendicular direction to the film surface, and stores information by the magnetization directions. It is preferable that the storage layer 180 be formed of the ferromagnetic material that has the coercivity of the degree that the magnetization direction is not reversed by disturbance from outside. The storage layer 180 may be formed of amorphous perpendicular magnetization material such as TbFeCo and GdFeCo, magnetic material that has crystal magnetic anisotropy such as CoPt and FePt, or alloy magnetic material of at least one or more selected from among Fe, Co, and Ni and at least one or more selected from among B and C, for example.

Note that the storage layer 180 may be a single-layer film, and may be a multi-layer stack film. For example, the storage layer 180 may be a stack film of a non-magnetic layer and a magnetic layer, or a stack film of an oxide layer and a magnetic layer. The film thickness of the storage layer 180 may be 1 nm or more and 10 nm or less, for example.

The reference layer 160 is provided at one surface side of the storage layer 180 with the spin injection layer 170 in between. The reference layer 160 is formed such that the magnetization direction is fixed to one direction in the ferromagnetic material, and functions as a reference for the magnetization direction retained in the storage layer 180. Specifically, the reference layer 160 is formed to have the magnetization fixed in the direction perpendicular to the film surface and toward the storage layer 180.

It is preferable that the reference layer 160 be formed of ferromagnetic material having a large polarizability of the magnetization and a large magnetic resistance. The reference layer 160 may be formed of amorphous perpendicular magnetization material such as TbFeCo and GdFeCo, magnetic material that includes crystal magnetic anisotropy such as CoPt and FePt, or alloy magnetic material of at least one or more selected from among Fe, Co, and Ni and at least one or more selected from among B and C, for example. The film thickness of the reference layer 160 may be 0.5 nm or more and 10 nm or less, for example.

The spin injection layer 170 is formed of non-magnetic material, and is provided and sandwiched between the storage layer 180 and the reference layer 160. The spin injection layer 170 reverses the magnetization direction of the storage layer 180, by exchanging the spin-polarized electron between the storage layer 180 and the reference layer 160, at the time of write of information to the storage layer 180. Also, the spin injection layer 170 changes the electrical resistance on the basis of the magnetization direction of each of the storage layer 180 and the reference layer 160 by the magnetoresistance effect, at the time of readout of information from the storage layer 180. Thereby, the spin injection layer 170 can read out the change in the magnetization direction retained in the storage layer 180 as the change of the electrical resistance.

The spin injection layer 170 may be formed of any of metal material and insulator material, as long as the material is a non-magnetic body. Note that it is preferable that the spin injection layer 170 be formed of non-magnetic insulator material, in order to obtain a readout signal of a higher quality. Specifically, it is preferable that the spin injection layer 170 be formed of oxide material such as MgO and $Al_2O_3$. The film thickness of the spin injection layer 170 may be 0.3 nm or more and 5 nm or less, for example.

When the spin injection layer 170 is formed of the non-magnetic insulator material, the storage layer 180, the spin injection layer 170, and the reference layer 160 function as what is called a ferromagnetic tunnel junction (magnetic tunnel junction: MTJ) element. In this case, the magnetic resistance change rate becomes larger in the spin injection layer 170, and thus the change in the magnetization direction can be detected as a larger change of the electrical resistance at the time of the readout of the information.

The magnetization fixation layer 140 is provided at the surface side opposite to the surface of the reference layer 160 on which the spin injection layer 170 is provided, with the magnetization coupling layer 150 in between. The magnetization fixation layer 140 is formed of the magnetic body including the ferromagnetic material having the magnetization direction antiparallel to the reference layer 160, and magnetically couples with the reference layer 160. Thereby, the magnetization fixation layer 140 can cancel the leak magnetic field from the reference layer 160. Also, the magnetization fixation layer 140 can stabilize the magnetization direction of the reference layer 160 by magnetically coupling with the reference layer 160, and improve the retention characteristics of the magnetization of the reference layer 160.

It is preferable that the magnetization fixation layer 140 be formed of ferromagnetic material of large coercivity. The magnetization fixation layer 140 may be formed of amorphous perpendicular magnetization material such as TbFeCo and GdFeCo, magnetic material that has the crystal magnetic anisotropy such as CoPt and FePt, or alloy magnetic material of at least one or more selected from among Fe, Co, and Ni and at least one or more selected from among B and C, for example. The film thickness of the magnetization fixation layer 140 may be 0.5 nm or more and 20 nm or less, for example.

The magnetization coupling layer 150 is provided and sandwiched between the reference layer 160 and the magnetization fixation layer 140. The magnetization coupling layer 150 is formed of non-magnetic material, and magnetically couples the reference layer 160 and the magnetization fixation layer 140. It is preferable that the magnetization coupling layer 150 be formed of a material that makes the reference layer 160 and the magnetization fixation layer 140 have magnetization directions antiparallel to each other and magnetically couples the reference layer 160 and the magnetization fixation layer 140 strongly. It is preferable that the magnetization coupling layer 150 is formed of non-magnetic metal material such as Cr, Cu, Ru, Re, Rh, and Os, for example. The film thickness of the magnetization coupling layer 150 may be 0.3 nm or more and 2 nm or less, for example.

The magnetization assist layer 120 is provided at the surface side of the magnetization fixation layer 140 opposite to the surface on which the magnetization coupling layer 150 is provided, with the non-magnetic layer 130 in between. The magnetization assist layer 120 is formed of ferromagnetic material in such a manner that the magnetization easy axis is directed in the direction perpendicular to the film surface. Also, the magnetization assist layer 120 reverses its magnetization in advance of the storage layer 180 at the time of the write into the storage layer 180, and applies the external magnetic field to the storage layer 180. Thereby, the magnetization assist layer 120 applies to the storage layer 180 the external magnetic field parallel to the magnetization reversal direction of the storage layer 180, thereby reducing the occurrence of the LPBS and achieving a sufficiently low write error rate without applying excessively high voltage.

It is preferable that the magnetization assist layer 120 be of a smaller magnetization reversal electric current than the storage layer 180. More specifically, it is preferable that the magnetization assist layer 120 is formed of ferromagnetic material having a smaller coercivity than the storage layer 180. The magnetization assist layer 120 may be formed of amorphous perpendicular magnetization material such as TbFeCo and GdFeCo, magnetic material that has crystal magnetic anisotropy such as CoPt and FePt, or alloy magnetic material of at least one or more selected from among Fe, Co, and Ni and at least one or more selected from among B and C, for example.

Note that the magnetization assist layer 120 may be a single-layer film, and may be a multi-layer stack film. For example, the magnetization assist layer 120 may be formed of a stack film of Co and Ni, or a stack film of Ni and Pd. The film thickness of the magnetization assist layer 120 may be 0.5 nm or more and 5 nm or less, for example.

The non-magnetic layer 130 is formed of non-magnetic material, and is provided and sandwiched between the magnetization fixation layer 140 and the magnetization assist layer 120. The non-magnetic layer 130 reverses the magnetization direction of the magnetization assist layer 120, by exchanging the spin-polarized electrons between the magnetization assist layer 120 and the magnetization fixation layer 140, at the time of write of information into the storage layer 180.

The non-magnetic layer 130 may be formed of any of metal material and insulator material, as long as the material is non-magnetic body. For example, the non-magnetic layer 130 may be formed of oxide material such as MgO and $Al_2O_3$ that is the same as the spin injection layer 170, and may be formed of non-magnetic metal material such as Cu or Au whose spin scattering length is long. Note that it is preferable that the non-magnetic layer 130 is formed of a non-magnetic body having a small resistance. This is to reduce the increased amount of the resistance by the existence of the non-magnetic layer 130. The film thickness of the non-magnetic layer 130 may be 0.3 nm or more and 5 nm or less, for example.

Here, as illustrated in FIG. 1, when the magnetization fixation layer 140 is provided on the magnetization assist layer 120, it is preferable that the magnetization assist layer 120 and the magnetization fixation layer 140 are formed of the material having the substantially identical direction of the crystal orientation and the magnetic anisotropy. This is because the crystalline orientation of the magnetization fixation layer 140 is controlled to have the magnetic anisotropy in a specific direction, by controlling the crystal orientation and the magnetic anisotropy from the magnetization assist layer 120, thereby increasing the coercivity of the magnetization fixation layer 140.

Specifically, when the magnetization fixation layer 140 is a film that has the magnetic anisotropy in the 3-fold rotational symmetry axis direction of a hexagonal crystal, it is preferable that the magnetization assist layer 120 is a film that has the magnetic anisotropy in the 3-fold rotational symmetry axis direction of the hexagonal crystal in the same way. For example, when the magnetization fixation layer 140 is a film made of CoPt alloy, a film made of CoNiPt alloy, or a stack film of Pt, Pd, or Ni and Co, it is preferable that the magnetization assist layer 120 be a film made of alloy of Pt, Cr, W, Mo, or Ni and Co, or a stack film of Pt, Pd, or Ni and Co.

Also, when the magnetization fixation layer 140 is a film that has the magnetic anisotropy in the 4-fold rotational symmetry axis direction of a tetragonal crystal, it is preferable that the magnetization assist layer 120 be a film that has the magnetic anisotropy in the 4-fold rotational symmetry axis direction of the tetragonal crystal in the same way. For example, when the magnetization fixation layer 140 is a film made of FePt alloy, a film made of CoPt alloy, or a film made of FePd alloy, it is preferable that the magnetization assist layer 120 be a film made of alloy of Pt, Pd, or Ni and Fe.

Note that the method for controlling the crystal orientation and the magnetic anisotropy of the magnetization fixation layer 140 is not limited to the above. For example, the crystal orientation and the magnetic anisotropy of the magnetization fixation layer 140 may be controlled, by using for the non-magnetic layer 130 an oxide such as MgO that is easily oriented in the 4-fold rotational symmetry axis, and by using the interface magnetic anisotropy generated on the interface between the non-magnetic layer 130 and the magnetization fixation layer 140. Thereby, the crystal orientation and the magnetic anisotropy of the magnetization fixation layer 140 can be controlled to have the magnetic anisotropy in the 4-fold rotational symmetry axis direction of a tetragonal crystal, without controlling the crystal orientation and the magnetic anisotropy of the magnetization assist layer 120.

The first electrode layer 110 and the second electrode layer 190 is provided to sandwich the magnetization assist layer 120, the non-magnetic layer 130, the magnetization fixation layer 140, the magnetization coupling layer 150, the reference layer 160, the spin injection layer 170, and the storage layer 180.

Specifically, the first electrode layer 110 is provided under the magnetization assist layer 120, and functions as a lower electrode of the magnetic storage element 1. The first electrode layer 110 can be formed of various types of metal materials or alloy materials. Also, the first electrode layer 110 may control the crystal orientation of the magnetization assist layer 120 that is stacked on the first electrode layer 110. For example, the first electrode layer 110 may be formed of the metal material having the crystal structure and the magnetic anisotropy substantially same as the magnetization assist layer 120. The film thickness of the first electrode layer 110 may be 0.5 nm or more and 50 nm or less, for example.

The second electrode layer 190 is provided on the storage layer 180, and functions as an upper electrode of the magnetic storage element 1. Also, the second electrode layer 190 may function as a protection layer of the magnetic storage element 10. The second electrode layer 190 can be formed of various types of metal materials or alloy materials. The film thickness of the second electrode layer 190 may be 0.5 nm or more and 50 nm or less, for example.

Here, the behavior at the time of write of the magnetic storage element 1 according to the present embodiment will be described with reference to FIGS. 2A and 2B. FIG. 2A is an explanatory diagram illustrating the behavior of the magnetic storage element 1 at the time of L write in which the magnetization directions of the storage layer 180 and the reference layer 160 are antiparallel, and FIG. 2B is an explanatory diagram illustrating the behavior of the magnetic storage element 1 at the time of H write in which the magnetization directions of the storage layer 180 and the reference layer 160 are parallel.

As illustrated in FIG. 2A, when the magnetization directions are antiparallel at the storage layer 180 and the reference layer 160, the electric current is flowed from the second electrode layer 190 to the first electrode layer 110, and the electron is moved from the first electrode layer 110 to the second electrode layer 190, in order to reverse the magnetization direction of the storage layer 180.

In this case, the magnetization assist layer 120 receives the torque from the electron whose spin has become antiparallel to the magnetization direction of the magnetization fixation layer 140 by being reflected at the magnetization fixation layer 140, and thus the magnetization of the magnetization assist layer 120 becomes antiparallel to the magnetization fixation layer 140 by the spin torque magnetization reversal. Thereby, the magnetization assist layer 120 applies the external magnetic field in the direction parallel to the reference layer 160 to the storage layer 180, and thereby can prompt the magnetization reversal of the storage layer 180.

Also, as illustrated in FIG. 2B, when the magnetization directions are parallel at the storage layer 180 and the reference layer 160, the electric current is flowed from the first electrode layer 110 to the second electrode layer 190, and the electron is moved from the second electrode layer 190 to the first electrode layer 110, in order to reverse the magnetization direction of the storage layer 180.

In this case, the magnetization assist layer 120 receives the torque from the electron that has the spin parallel to the magnetization direction of the magnetization fixation layer 140, and thus the magnetization of the magnetization assist layer 120 becomes parallel to the magnetization fixation layer 140 by the spin torque magnetization reversal. Thereby, the magnetization assist layer 120 applies the external magnetic field in the antiparallel direction to the reference layer 160 to the storage layer 180, and thus can prompt the magnetization reversal of the storage layer 180.

Thus, even when the magnetization of the storage layer 180 is reversed in any direction, the magnetization assist layer 120 can apply the external magnetic field parallel to the reversal direction to the storage layer 180. Thus, in the storage layer 180, the magnetization reversal is prompted, and thereby the occurrence of the LPBS is reduced, and thus the magnetic storage element 1 can achieve the write error rate that is sufficiently low even with lower applied voltage.

Note that it is preferable to make the reversal electric current of the magnetization of the magnetization assist layer 120 smaller than the storage layer 180, to cause the magnetization assist layer 120 to reverse its magnetization in advance of the storage layer 180. That is, referring to the above equation 2, it is preferable that the index A of the thermal stability of the magnetization assist layer 120 be made smaller than the storage layer 180. More specifically, when the volumes of the magnetization assist layer 120 and the storage layer 180 are approximately equal, it is preferable that the coercivity of the magnetization assist layer 120 be made smaller than the storage layer 180.

The magnetic storage element 1 according to the present embodiment described in the above can be produced by using a publicly known method. Specifically, the magnetic storage element 1 can be produced by stacking the layers by using various types of vacuum vapor deposition methods. For example, the magnetic storage element 1 can be produced by stacking the layers sequentially, by using a physical vapor deposition method such as a sputtering method and a molecular beam epitaxy method, and a chemical vapor deposition method such as a chemical vapor deposition (CVD) method and an atomic layer deposition (ALD) method.

(2.2. Exemplary Variant)

Next, exemplary variants of the magnetic storage element 1 according to the present embodiment will be described with reference to FIGS. 3 to 5. FIG. 3 is an explanatory diagram that schematically illustrates a stacking structure of a magnetic storage element according to a first exemplary variant, and FIG. 4 is an explanatory diagram that schematically illustrates a stacking structure of a magnetic storage element according to a second exemplary variant, and FIG. 5 is an explanatory diagram that schematically illustrates a stacking structure of a magnetic storage element according to a third exemplary variant.

(First Exemplary Variant)

As illustrated in FIG. 3, in a magnetic storage element 2 according to the first exemplary variant, the stacking order of the layers between the first electrode layer 210 and the second electrode layer 290 is reversed from the magnetic storage element 1 illustrated in FIG. 1.

Specifically, in the magnetic storage element 2, a storage layer 280 is provided on a first electrode layer 210, and a reference layer 260 is provided on the storage layer 280 with a spin injection layer 270 in between, and a magnetization fixation layer 240 is provided on the reference layer 260 with a magnetization coupling layer 250 in between, and a magnetization assist layer 220 is provided on the magnetization fixation layer 240 with a non-magnetic layer 230 in between, and a second electrode layer 290 is provided on a magnetization assist layer 220.

Note that configuration other than the stacking order of the first electrode layer 210, the magnetization assist layer 220, the non-magnetic layer 230, the magnetization fixation layer 240, the magnetization coupling layer 250, the reference layer 260, the spin injection layer 270, the storage layer 280, and the second electrode layer 290 is substantially same as the first electrode layer 110, the magnetization assist layer 120, the non-magnetic layer 130, the magnetization fixation layer 140, the magnetization coupling layer 150, the reference layer 160, the spin injection layer 170, the storage layer 180, and the second electrode layer 190 of the same names that are described in FIG. 1, and thus description will be omitted here.

Note that, in the magnetic storage element 2, the magnetization assist layer 220 is provided above the magnetization fixation layer 240. Thus, the magnetization assist layer 220 can be formed without considering the crystal orientation and the magnetic anisotropy of the magnetization fixation layer 240.

Also, the magnetization assist layer 220 may direct the magnetization easy axis toward the perpendicular direction to the film surface, by using the interface anisotropy generated at the interface with the non-magnetic layer 230. For example, the magnetization assist layer 220 can also be formed of an arbitrary ferromagnet film, by forming the non-magnetic layer 230 out of oxide such as MgO and generating the interface anisotropy. In this case, the magnetization assist layer 220 can be formed of ferromagnet made of an alloy of at least one or more selected from a group consisting of Fe, Co, and Ni and one or more selected from a group consisting of B and C.

In the magnetic storage element 2 according to the first exemplary variant, the magnetization assist layer 220 can apply to the storage layer 280 an external magnetic field parallel to the reversal direction of the magnetization of the storage layer 280, at the time of the write into the storage layer 280, thereby reducing the occurrence of the LPBS in the storage layer 280.

(Second Exemplary Variant)

As illustrated in FIG. 4, a magnetic storage element 3 according to the second exemplary variant is provided with reference layers (a first reference layer 361, a second reference layer 362) and magnetization fixation layers (a first magnetization fixation layer 341, a second magnetization fixation layer 342) at both sides with a storage layer 380 therebetween, in addition to the magnetic storage element 1 illustrated in FIG. 1.

Specifically, in the magnetic storage element 3, the first reference layer 361 is provided under the storage layer 380 with a first spin injection layer 371 in between, and the first magnetization fixation layer 341 is provided under the first reference layer 361 with a first magnetization coupling layer 351 in between. Also, in the same way, the second reference layer 362 is provided on the storage layer 380 with a second spin injection layer 372 in between, and the second magnetization fixation layer 342 is provided on the second reference layer 362 with a second magnetization coupling layer 352 in between.

A magnetization assist layer 320 is provided on one surface of the first magnetization fixation layer 341 or the second magnetization fixation layer 342 with a non-magnetic layer 330 in between. FIG. 4 illustrates a structure in which the magnetization assist layer 320 provided at a surface side opposite to the surface of the first magnetization fixation layer 341 on which the first magnetization coupling layer 351 is provided, with the non-magnetic layer 330 in between. Note that it is needless to say that the magnetization assist layer 320 may be provided at a surface side opposite to the surface of the second magnetization fixation layer 342 on which the second magnetization coupling layer 352 is provided, with the non-magnetic layer 330 in between.

Further, the first electrode layer 310 and the second electrode layer 390 are provided to sandwich the above magnetization assist layer 320, the non-magnetic layer 330, the first magnetization fixation layer 341, the first magnetization coupling layer 351, the first reference layer 361, the first spin injection layer 371, the storage layer 380, the second spin injection layer 372, the second reference layer 362, the second magnetization coupling layer 352, and the second magnetization fixation layer 342.

Note that the first electrode layer 310, the magnetization assist layer 320, the non-magnetic layer 330, the storage layer 380, and the second electrode layer 390 are substantially same as the first electrode layer 110, the magnetization assist layer 120, the non-magnetic layer 130, the storage layer 180, and the second electrode layer 190 of the same names that are described in FIG. 1, and thus description will be omitted here. Also, the first magnetization fixation layer 341 and the second magnetization fixation layer 342 are substantially same as the magnetization fixation layer 140, and the first magnetization coupling layer 351 and the second magnetization coupling layer 352 are substantially same as the magnetization coupling layer 150, and the first reference layer 361 and the second reference layer 362 are substantially same as the reference layer 160, and the first spin injection layer 371 and the second spin injection layer 372 are substantially same as the spin injection layer 170, and thus description will be omitted here.

In the magnetic storage element 3 according to the second exemplary variant, the first reference layer 361 and the second reference layer 362 are provided on both surfaces of the storage layer 380 that are opposite to each other, respectively. Thereby, the magnetic storage element 3 can impart a spin torque from each of the first reference layer 361 and the second reference layer 362 to the storage layer 380, when writing information into the storage layer 380. Thus, the magnetic storage element 3 can reduce the reversal electric current of the storage layer 380, and thereby information is written into the storage layer 380 more easily.

Also, in the magnetic storage element 3 according to the second exemplary variant as well, the magnetization assist layer 320 can apply to the storage layer 380 an external magnetic field parallel to the reversal direction of the magnetization of the storage layer 380, at the time of write into the storage layer 380. Thus, in the magnetic storage element 3 according to the second exemplary variant as well, the magnetization assist layer 320 can reduce the occurrence of the LPBS in the storage layer 380.

(Third Exemplary Variant)

As illustrated in FIG. 5, in a magnetic storage element 4 according to the third exemplary variant, reference layers (a first reference layer 461, a second reference layer 462), magnetization fixation layers (a first magnetization fixation layer 441, a second magnetization fixation layer 442), and magnetization assist layers (a first magnetization assist layer 421, a second magnetization assist layer 422) are provided at both sides with a storage layer 480 therebetween, in addition to the magnetic storage element 1 illustrated in FIG. 1.

Specifically, in the magnetic storage element 4, the first reference layer 461 is provided under the storage layer 480 with a first spin injection layer 471 in between, and the first magnetization fixation layer 441 is provided under the first reference layer 461 with a first magnetization coupling layer 451 in between, and the first magnetization assist layer 421 is provided under the first magnetization fixation layer 441 with a first non-magnetic layer 431 in between. Also, in the same way, the second reference layer 462 is provided on the storage layer 480 with a second spin injection layer 472 in between, and the second magnetization fixation layer 442 is provided on the second reference layer 462 with a second magnetization coupling layer 452 in between, and the second magnetization assist layer 422 is provided on the second magnetization fixation layer 442 with a second non-magnetic layer 432 in between.

Further, a first electrode layer 410 and a second electrode layer 490 are provided to sandwich the above first magnetization assist layer 421, the first non-magnetic layer 431, the first magnetization fixation layer 441, the first magnetization coupling layer 451, the first reference layer 461, the first spin injection layer 471, the storage layer 480, the second spin injection layer 472, the second reference layer 462, the second magnetization coupling layer 452, the second magnetization fixation layer 442, the second non-magnetic layer 432, and the second magnetization assist layer 422.

Note that the first electrode layer 410, the storage layer 480, and the second electrode layer 490 are substantially same as the first electrode layer 110, the storage layer 180, and the second electrode layer 190 of the same names that are described in FIG. 1, and thus description will be omitted here. Also, the first magnetization assist layer 421 and the second magnetization assist layer 422 are substantially same as the magnetization assist layer 120, and the first non-magnetic layer 431 and the second non-magnetic layer 432 are substantially same as the non-magnetic layer 130, and the first magnetization fixation layer 441 and the second magnetization fixation layer 442 are substantially same as the magnetization fixation layer 140, and the first magnetization coupling layer 451 and the second magnetization coupling layer 452 are substantially same as the magnetization coupling layer 150, and the first reference layer 461 and the second reference layer 462 are substantially same as the reference layer 160, and the first spin injection layer 471 and the second spin injection layer 472 are substantially same as the spin injection layer 170, and thus description will be omitted here.

In the magnetic storage element 4 according to the third exemplary variant, the first reference layer 461 and the second reference layer 462 are provided, on both surfaces of the storage layer 480 that are opposite to each other respectively, in the same way as the magnetic storage element 3 according to the second exemplary variant. Thereby, the magnetic storage element 4 can reduce the reversal electric current of the storage layer 480, and thereby information is written into the storage layer 480 more easily.

Also, in the magnetic storage element 4 according to the third exemplary variant, the first magnetization assist layer 421 and the second magnetization assist layer 422 are provided at both surface sides of the storage layer 480 that are opposite to each other, respectively. Thereby, the magnetic storage element 4 can apply an external magnetic field from each of the first magnetization assist layer 421 and the second magnetization assist layer 422 to the storage layer 480, when writing information into the storage layer 480. Thus, the magnetic storage element 4 can further reduce the occurrence of the LPBS in the storage layer 480.

3. Working Example of Present Disclosure

Next, working examples and a comparative example of the magnetic storage element according to an embodiment of the present disclosure will be described with reference to FIGS. 6 to 16. Note that the working examples described below are just an example, and the magnetic storage element according to the present embodiment is not limited to the below working examples.

Working Example 1

First, working example 1 of the magnetic storage element according to the present embodiment will be described with reference to FIG. 6. FIG. 6 is an explanatory diagram illustrating a layer structure of the magnetic storage element according to the working example 1. The magnetic storage element according to the working example 1 corresponds to the magnetic storage element 1 illustrated in FIG. 1.

As illustrated in FIG. 6, first, the first electrode layer 110 is formed of stack films of Ta (film thickness 5 nm) and Ru (film thickness 2 nm), and the magnetization assist layer 120 is formed of CoCr (film thickness 3 nm), and the non-magnetic layer 130 is formed of Cu (film thickness 1 nm). Also, the magnetization fixation layer 140 is formed of CoPt (film thickness 2 nm), and the magnetization coupling layer 150 is formed of Ru (film thickness 0.7 nm), and the reference layer 160 is formed of FeCoB (film thickness 1 nm), and the spin injection layer 170 is formed of MgO (film thickness 0.7 nm).

Further, the storage layer 180 is formed of stack films of FeCoB (film thickness 1.2 nm), Ta (film thickness 0.2 nm), and FeCoB (film thickness 1.2 nm), and the second electrode layer 190 is formed of stack films of MgO (film thickness 0.5 nm), Ru (film thickness 2 nm), and Ta (film thickness 5 nm). These stack structures are formed in a cylindrical shape of diameter 50 nm, to form the magnetic storage element according to the working example 1.

Comparative Example

Next, the comparative example of the magnetic storage element will be described with reference to FIG. 7. FIG. 7 is an explanatory diagram illustrating a layer structure of the magnetic storage element according to the comparative example. The comparative example corresponds to the magnetic storage element 10 illustrated in FIG. 17.

As illustrated in FIG. 7, first, the first electrode layer 11 is formed of stack films of Ta (film thickness 5 nm) and Ru (film thickness 2 nm), and the magnetization fixation layer 14 is formed of CoPt (film thickness 2 nm), and the magnetization coupling layer 15 is formed of Ru (film thickness 0.7 nm). Also, the reference layer 16 is formed of FeCoB (film thickness 1 nm), and the spin injection layer 17 is formed of MgO (film thickness 0.7 nm).

Further, the storage layer 18 is formed of stack films of FeCoB (film thickness 1.2 nm), Ta (film thickness 0.2 nm), and FeCoB (film thickness 1.2 nm), and the second electrode layer 19 is formed of stack films of MgO (film thickness 0.5 nm), Ru (film thickness 2 nm), and Ta (film thickness 5 nm). These stack structures are formed in a cylindrical shape of diameter 50 nm, to form the magnetic storage element according to the comparative example.

(Evaluation Result)

A relationship of write error rate in relation to applied voltage is evaluated, with regard to the magnetic storage element according to the working example 1 and the comparative example which are formed in the above. Specifically, write is performed repeatedly $10^6$ times into 1 Mbit of the magnetic storage element according to the working example 1 and the comparative example, and the relationship between the write error rate in this case and the voltage between the first electrode layer and the second electrode layer is evaluated.

The result is illustrated in FIGS. 8 and 9. FIG. 8 is a graph diagram that illustrates the relationship between the write error rate of the magnetic storage element according to the working example 1 and the applied voltage, and FIG. 9 is a graph diagram that illustrates the relationship between the write error rate of the magnetic storage element according to the comparative example and the applied voltage.

Referring to FIGS. 8 and 9, in the magnetic storage element according to the comparative example, as the applied voltage increases, the LPBS that makes it difficult for the write error rate to decrease occurs, in either one of L write and H write. On the other hand, in the magnetic storage element according to the working example 1, the phenomenon that makes it difficult for the write error rate to decrease, which is observed in the magnetic storage element according to the comparative example, is not observed in either one of L write and H write, thereby reducing the occurrence of the LPBS.

Working Examples 2 and 3

Next, working examples 2 and 3 that use FePt having the magnetic anisotropy in the 4-fold rotational symmetry axis direction of the tetragonal crystal as the magnetization fixation layer 140 in the working example 1 will be described with reference to FIGS. 10 and 11. In this case, the crystal orientation of the magnetization fixation layer 140 can be improved, by forming the magnetization assist layer 120 of a ferromagnetic material of substantially identical crystal orientation and magnetic anisotropy, or forming the non-magnetic layer 130 of an oxide material that generates interface magnetic anisotropy.

FIG. 10 is an explanatory diagram illustrating a layer structure of the magnetic storage element according to the working example 2 in which the magnetization assist layer 120 is formed of a ferromagnetic material that has the magnetic anisotropy in the 4-fold rotational symmetry axis direction of a tetragonal crystal.

As illustrated in FIG. 10, the first electrode layer 110 is formed of stack films of Ta (film thickness 5 nm) and TiN (film thickness 5 nm), and the magnetization assist layer 120 is formed of a stack film of Ni/Pd (film thickness 5 nm) having the magnetic anisotropy in the 4-fold rotational symmetry axis direction of a tetragonal crystal, and the non-magnetic layer 130 is formed of MgO (film thickness 0.5 nm), and the magnetization fixation layer 140 is formed of FePt (film thickness 2 nm). The layer structure that is the same as the working example 1 can be employed for the layer structure of and after the magnetization coupling layer 150, and thus description will be omitted here. For example, these stack structures are formed in a cylindrical shape of diameter 50 nm, to form the magnetic storage element according to the working example 2.

FIG. 11 is an explanatory diagram illustrating a layer structure of the magnetic storage element according to the working example 3 in which the non-magnetic layer 130 is formed of an oxide material that generates interface magnetic anisotropy.

As illustrated in FIG. 11, the first electrode layer 110 is formed of Ta (film thickness 5 nm), and the magnetization assist layer 120 is formed of FeCoB (film thickness 1 nm). Here, the non-magnetic layer 130 is formed of MgO (film thickness 0.5 nm), and the magnetization fixation layer 140 is formed of FePt (film thickness 2 nm). Thereby, the interface magnetic anisotropy can be generated at the interface between the non-magnetic layer 130 and the magnetization fixation layer 140. The layer structure that is the same as the working example 1 can be employed for the layer structure of and after the magnetization coupling layer 150, and thus description will be omitted here. For example, these stack structures are formed in a cylindrical shape of diameter 50 nm, to form the magnetic storage element according to the working example 3.

Working Examples 4 and 5

Next, working examples 4 and 5 of the magnetic storage element according to the present embodiment will be described with reference to FIGS. 12 and 13. FIG. 12 is an explanatory diagram illustrating a layer structure of the magnetic storage element according to the working example 4, and FIG. 13 is an explanatory diagram illustrating a layer structure of the magnetic storage element according to the working example 5. The magnetic storage elements according to the working examples 4 and 5 correspond to the magnetic storage element 2 according to the first exemplary variant illustrated in FIG. 3.

As illustrated in FIG. 12, the magnetic storage element according to the working example 4 is the working example in which CoCr having the magnetic anisotropy in the 3-fold rotational symmetry axis direction of a hexagonal crystal is used as the magnetization assist layer 220.

As illustrated in FIG. 12, first, the first electrode layer 210 is formed of stack films of Ta (film thickness 5 nm), FeCoB (film thickness 0.5 nm), and MgO (film thickness 0.5 nm), and the storage layer 280 is formed of stack films of FeCoB (film thickness 1.2 nm), Ta (film thickness 0.2 nm), and FeCoB (film thickness 1.2 nm), and the spin injection layer 270 is formed of MgO (film thickness 0.7 nm).

Also, the reference layer 260 is formed of stack films of FeCoB (film thickness 0.5 nm) and CoCr (film thickness 2 nm), and the magnetization coupling layer 250 is formed of Ru (film thickness 0.7 nm), and the magnetization fixation layer 240 is formed of CoPt (film thickness 2 nm). Further, the non-magnetic layer 230 is formed of Cu (film thickness 1 nm), and the magnetization assist layer 220 is formed of CoCr (film thickness 3 nm), and the second electrode layer 290 is formed of Ta (film thickness 5 nm). For example, these stack structures are formed in a cylindrical shape of diameter 50 nm, to form the magnetic storage element according to the working example 4.

As illustrated in FIG. 13, the magnetic storage element according to the working example 5 is the working example in which the interface magnetic anisotropy is generated at the interface between the magnetization assist layer 220 and the non-magnetic layer 230.

As illustrated in FIG. 13, first, the first electrode layer 210 is formed of stack films of Ta (film thickness 5 nm), FeCoB (film thickness 0.5 nm), and MgO (film thickness 0.5 nm), and the storage layer 280 is formed of stack films of FeCoB (film thickness 1.2 nm), Ta (film thickness 0.2 nm), and FeCoB (film thickness 1.2 nm), and the spin injection layer 270 is formed of MgO (film thickness 0.7 nm).

Also, the reference layer 260 is formed of stack films of FeCoB (film thickness 0.5 nm) and CoCr (film thickness 2 nm), and the magnetization coupling layer 250 is formed of Ru (film thickness 0.7 nm), and the magnetization fixation layer 240 is formed of CoPt (film thickness 2 nm). Further, the non-magnetic layer 230 is formed of $MgAl_2O_4$ (film thickness 0.5 nm), and the magnetization assist layer 220 is formed of FeCoC (film thickness 1 nm), and the second electrode layer 290 is formed of Ta (film thickness 5 nm). For example, these stack structures are formed in a cylindrical shape of diameter 50 nm, to form the magnetic storage element according to the working example 5.

Working Examples 6 and 7

Next, working examples 6 and 7 of the magnetic storage element according to the present embodiment will be described with reference to FIGS. 14 and 15. FIG. 14 is an explanatory diagram illustrating a layer structure of the magnetic storage element according to the working example 6, and FIG. 15 is an explanatory diagram illustrating a layer structure of the magnetic storage element according to the working example 7. The magnetic storage elements according to the working examples 6 and 7 correspond to the magnetic storage element 3 according to the second exemplary variant illustrated in FIG. 4.

As illustrated in FIG. 14, the magnetic storage element according to the working example 6 is the working example in which the magnetization assist layer 320 and the non-magnetic layer 330 are provided at the first electrode layer 310 side with respect to the storage layer 380.

As illustrated in FIG. 14, first, the first electrode layer 310 is formed of stack films of Ta (film thickness 5 nm) and Ru (film thickness 5 nm), and the magnetization assist layer 320 is formed of a stack film of Co/Ni (film thickness 1.5 nm), and the non-magnetic layer 330 is formed of $Al_2O_3$ (film thickness 0.5 nm).

Also, the first magnetization fixation layer 341 is formed of CoPt (film thickness 2 nm), and the first magnetization coupling layer 351 is formed of Ru (film thickness 0.7 nm), and the first reference layer 361 is formed of FeCoB (film thickness 1 nm), and the first spin injection layer 371 is formed of MgO (film thickness 0.7 nm). Subsequently, the storage layer 380 is formed of stack films of FeCoB (film thickness 1.2 nm), Ta (film thickness 0.2 nm), and FeCoB (film thickness 1.2 nm).

Further, the second spin injection layer 372 is formed of MgO (film thickness 0.5 nm), and the second reference layer 362 is formed of FePd (film thickness 2 nm), and the second magnetization coupling layer 352 is formed of Rh (film thickness 0.6 nm), and the second magnetization fixation layer 342 is formed of FePt (film thickness 2 nm), and the second electrode layer 390 is formed of stack films of Rh (film thickness 1 nm) and Ta (film thickness 5 nm). For example, these stack structures are formed in a cylindrical shape of diameter 50 nm, to form the magnetic storage element according to the working example 6.

As illustrated in FIG. 15, the magnetic storage element according to the working example 7 is the working example in which the magnetization assist layer 320 and the non-magnetic layer 330 are provided at the second electrode layer 390 side with respect to the storage layer 380.

As illustrated in FIG. 15, first, the first electrode layer 310 is formed of stack films of Ta (film thickness 5 nm) and Pt (film thickness 5 nm), and the first magnetization fixation layer 341 is formed of CoPt (film thickness 2 nm), and the first magnetization coupling layer 351 is formed of Ru (film thickness 0.7 nm), and the first reference layer 361 is formed of FeCoB (film thickness 1 nm), and the first spin injection layer 371 is formed of MgO (film thickness 0.7 nm). Subsequently, the storage layer 380 is formed of stack films of FeCoB (film thickness 1.2 nm), Ta (film thickness 0.2 nm), and FeCoB (film thickness 1.2 nm).

Further, the second spin injection layer 372 is formed of MgO (film thickness 0.5 nm), and the second reference layer 362 is formed of FeCoB (film thickness 1 nm), and the second magnetization coupling layer 352 is formed of Re (film thickness 0.5 nm), and the second magnetization fixation layer 342 is formed of a stack film of Co/Pd (film thickness 3 nm). Subsequently, the non-magnetic layer 330 is formed of Au (film thickness 1 nm), and the magnetization assist layer 320 is formed of a stack film of Co/Pd (film thickness 1.5 nm), and the second electrode layer 390 is formed of stack films of Au (film thickness 1 nm) and Ta (film thickness 5 nm). For example, these stack structures are formed in a cylindrical shape of diameter 50 nm, to form the magnetic storage element according to the working example 7.

Working Example 8

Next, working example 8 of the magnetic storage element according to the present embodiment will be described with reference to FIG. 16. FIG. 16 is an explanatory diagram illustrating a layer structure of the magnetic storage element according to the working example 8. The magnetic storage element according to the working example 8 corresponds to the magnetic storage element 4 according to the third exemplary variant illustrated in FIG. 5.

As illustrated in FIG. 16, first, the first electrode layer 410 is formed of Ta (film thickness 5 nm), and the first magnetization assist layer 421 is formed of FeCoB (film thickness 1 nm), and the first non-magnetic layer 431 is formed of MgO (film thickness 0.5 nm). Subsequently, the first magnetization fixation layer 441 is formed of FePt (film thickness 1 nm), and the first magnetization coupling layer 451 is formed of Ru (film thickness 0.7 nm), and the first reference layer 461 is formed of FePt (film thickness 1.2 nm), and the first spin injection layer 471 is formed of MgO (film thickness 0.7 nm). Subsequently, the storage layer 480 is formed of FePd (film thickness 2 nm).

Further, the second spin injection layer 472 is formed of MgO (film thickness 0.5 nm), and the second reference layer 462 is formed of FePt (film thickness 1 nm), and the second magnetization coupling layer 452 is formed of Ru (film thickness 0.7 nm), and the second magnetization fixation layer 442 is formed of FePt (film thickness 1.2 nm). Subsequently, the second non-magnetic layer 432 is formed of MgO (film thickness 0.5 nm), and the second magnetization assist layer 422 is formed of FeCoB (film thickness 1 nm), and the second electrode layer 490 is formed of Ta (film thickness 5 nm). For example, these stack structures are formed in a cylindrical shape of diameter 50 nm, to form the magnetic storage element according to the working example 8.

The relationship of the write error rate in relation to the applied voltage is evaluated for the magnetic storage elements according to the working examples 2 to 8 described above in the same way as the working example 1, and as a result it is found that the occurrence of the LPBS is reduced in both of the L write and the H write.

4. Conclusion

As described above, in the magnetic storage element according to an embodiment of the present disclosure, when information is written, an external magnetic field parallel to the magnetization reversal direction of the storage layer is applied to the storage layer by the magnetization assist layer, thereby reducing the occurrence of the LPBS that makes it difficult to decrease the write error rate. Thus, the magnetic storage element according to the present embodiment decreases the write error rate sufficiently, without increasing the applied voltage at the time of write excessively, thereby reducing the electric power consumption.

It should be understood by those skilled in the art that various modifications, combinations, sub-combinations and alterations may occur depending on design requirements and other factors insofar as they are within the scope of the appended claims or the equivalents thereof.

Further, the effects described in this specification are merely illustrative or exemplified effects, and are not limitative. That is, with or in the place of the above effects, the technology according to the present disclosure may achieve other effects that are clear to those skilled in the art based on the description of this specification.

Additionally, the present technology may also be configured as below.

(1) A magnetic storage element including:

a storage layer that has a magnetization easy axis in a perpendicular direction to a film surface, a magnetization direction of the storage layer being variable;

a reference layer provided at at least one surface side of the storage layer with a non-magnetic layer in between, and having magnetization whose direction is fixed in one direction perpendicular to a film surface;

a magnetization fixation layer provided at a surface side opposite to a surface of the reference layer at which the storage layer is provided, with a non-magnetic layer in between, and having magnetization whose direction is fixed in an antiparallel direction to a magnetization direction of the reference layer; and a magnetization assist layer provided at a surface side opposite to a surface of the magnetization fixation layer at which the reference layer is provided, with a non-magnetic layer in between, and having a magnetization easy axis in a perpendicular direction to a film surface, wherein change in a magnetization direction is easier than in the storage layer.

(2) The magnetic storage element according to (1), wherein an electric current amount that reverses magnetization of the magnetization assist layer is smaller than an electric current amount that reverses magnetization of the storage layer.

(3) The magnetic storage element according to (1) or (2), wherein
the magnetization assist layer is provided under the magnetization fixation layer with a non-magnetic layer in between, and
the magnetization fixation layer and the magnetization assist layer have substantially identical directions of crystal orientation and magnetic anisotropy.

(4) The magnetic storage element according to (3), wherein
the magnetization fixation layer is a film made of a CoPt alloy, a film made of a CoNiPt alloy, or stack films of Pt, Pd, or Ni and Co, and
the magnetization assist layer is a film made of an alloy of Cr, W, Mo, or Ni and Co, or stack films of Pt, Pd, or Ni and Co.

(5) The magnetic storage element according to (3), wherein
the magnetization fixation layer is a film made of an FePt alloy, a film made of a CoPt alloy, or a film made of an FePd alloy, and
the magnetization assist layer is a film made of an alloy of Pt, Pd, or Ni and Fe.

(6) The magnetic storage element according to (1) or (2), wherein
the magnetization assist layer is provided under the magnetization fixation layer with a non-magnetic layer in between,
the magnetization fixation layer is a film made of an FePt alloy, a film made of a CoPt alloy, or a film made of an FePd alloy, and
the non-magnetic layer between the magnetization fixation layer and the magnetization assist layer is a film made of an oxide material.

(7) The magnetic storage element according to (1) or (2), wherein
the magnetization assist layer is provided on the magnetization fixation layer with a non-magnetic layer in between,
the non-magnetic layer between the magnetization fixation layer and the magnetization assist layer is a film made of an oxide material, and
the magnetization assist layer is a film made of an alloy of at least one or more selected from a group consisting of Fe, Co, and Ni and at least one or more selected from a group consisting of B and C.

(8) The magnetic storage element according to any one of (1) to (7), wherein
the reference layer and the magnetization fixation layer are provided at each of both surface sides of the storage layer that are opposite to each other.

(9) The magnetic storage element according to (8), wherein
the magnetization assist layer is provided at each of both surface sides of the storage layer that are opposite to each other, with the reference layer and the magnetization fixation layer in between.

(10) The magnetic storage element according to any one of (1) to (9), wherein
the non-magnetic layer between the storage layer and the reference layer includes an oxide material having an insulation property.

(11) The magnetic storage element according to any one of (1) to (10), wherein
the non-magnetic layer between the reference layer and the magnetization fixation layer includes a non-magnetic metal material.

(12) A magnetic storage element including:
a storage layer that stores information by a magnetization direction; a reference layer whose magnetization direction is fixed, the reference layer serving as a reference for the magnetization direction of the storage layer;
a magnetization fixation layer that magnetically couples with the reference layer; and
a magnetization assist layer in which change in a magnetization direction is easier than in the storage layer,
wherein when information is written into the storage layer by a spin torque generated by an electric current that flows through the storage layer, the reference layer, the magnetization fixation layer, and the magnetization assist layer, the magnetization assist layer reverses magnetization in a parallel direction to the magnetization direction written into the storage layer, and applies an external magnetic field to the storage layer.

(13) The magnetic storage element according to (12), wherein
the magnetization assist layer is provided under the magnetization fixation layer with a non-magnetic layer in between, and
the magnetization fixation layer and the magnetization assist layer have substantially identical directions of crystal orientation and magnetic anisotropy.

(14) The magnetic storage element according to (13), wherein
the magnetization fixation layer is a film made of a CoPt alloy, a film made of a CoNiPt alloy, or stack films of Pt, Pd, or Ni and Co, and
the magnetization assist layer is a film made of an alloy of Cr, W, Mo, or Ni and Co, or stack films of Pt, Pd, or Ni and Co.

(15) The magnetic storage element according to (13), wherein
the magnetization fixation layer is a film made of an FePt alloy, a film made of a CoPt alloy, or a film made of an FePd alloy, and
the magnetization assist layer is a film made of an alloy of Pt, Pd, or Ni and Fe.

(16) The magnetic storage element according to (12), wherein
the magnetization assist layer is provided under the magnetization fixation layer with a non-magnetic layer in between,
the magnetization fixation layer is a film made of an FePt alloy, a film made of a CoPt alloy, or a film made of an FePd alloy, and
the non-magnetic layer between the magnetization fixation layer and the magnetization assist layer is a film made of an oxide material.

(17) The magnetic storage element according to (12), wherein
the magnetization assist layer is provided on the magnetization fixation layer with a non-magnetic layer in between,
the non-magnetic layer between the magnetization fixation layer and the magnetization assist layer is a film made of an oxide material, and
the magnetization assist layer is a film made of an alloy of at least one or more selected from a group consisting of Fe, Co, and Ni and at least one or more selected from a group consisting of B and C.

REFERENCE SIGNS LIST 1 magnetic storage element
110 first electrode layer
120 magnetization assist layer
130 non-magnetic layer
140 magnetization fixation layer
150 magnetization coupling layer
160 reference layer
170 spin injection layer
180 storage layer
190 second electrode layer

The invention claimed is:

1. A storage device comprising:
a first layer having a first magnetization direction perpendicular to a film surface,
a second layer having a second magnetization direction towards the first layer,
an intermediate layer provided between the first layer and the second layer,
a non-magnetic layer,
a third layer provided between the second layer and the non-magnetic layer, wherein the third layer has a third magnetization direction,
a fourth layer, wherein the non-magnetic layer is provided between the third layer and the fourth layer,
wherein the third magnetization direction of the third layer is towards the fourth layer, and is in an antiparallel direction to the second magnetization direction of the second layer, and
wherein the fourth layer is a magnetization assist layer and includes at least one of TbFeCo and GdFeCo.

2. The storage device according to claim 1, wherein the first layer includes Co, Fe, and B.

3. The storage device according to claim 2, wherein the first magnetization direction is revertible by a current.

4. The storage device according to claim 1, wherein the intermediate layer includes MgO.

5. The storage device according to claim 1, wherein the second layer includes Co, Fe, and B.

6. The storage device according to claim 1, wherein the third layer includes CoPt.

7. The storage device according to claim 1, further comprising a fifth layer provided on the first layer, and wherein the fifth layer includes MgO.

8. The storage device according to claim 7, further comprising a sixth layer and a seventh layer, and wherein the sixth layer is provided between the fifth layer and the seventh layer.

9. The storage device according to claim 8, wherein the sixth layer includes Ru.

10. The storage device according to claim 1, wherein a thickness of the fourth layer is larger than a thickness of the non-magnetic layer.

11. The storage device according to claim 1, wherein change of a magnetization direction in the fourth layer is easier than in the first layer.

12. The storage device according to claim 1, wherein the third layer has a fixed magnetization direction.

13. A memory comprising:
a storage device; and
at least two lines that intersect with each other,
wherein the storage device includes
a first layer having a first magnetization direction perpendicular to a film surface,
a second layer having a second magnetization direction towards the first layer,
an intermediate layer provided between the first layer and the second layer,
a non-magnetic layer,
a third layer provided between the second layer and the non-magnetic layer, wherein the third layer has a third magnetization direction,
a fourth layer, wherein the non-magnetic layer is provided between the third layer and the fourth layer,
wherein the third magnetization direction of the third layer is towards the fourth layer, and is in an antiparallel direction to the second magnetization direction of the second layer, and
wherein the fourth layer is a magnetization assist layer and includes at least one of TbFeCo and GdFeCo.

14. The memory according to claim 13, wherein the first layer includes Co, Fe, and B.

15. The memory according to claim 13, wherein the intermediate layer includes MgO.

16. The memory according to claim 13, wherein the second layer includes Co, Fe, and B.

17. The memory according to claim 13, wherein the third layer includes CoPt.

18. The memory according to claim 13, wherein further comprising a fifth layer provided on the first layer, and wherein the fifth layer includes MgO.

19. The memory according to claim 13, wherein change of a magnetization direction in the fourth layer is easier than in the first layer.

* * * * *